(12) United States Patent
Forbes et al.

(10) Patent No.: US 7,195,999 B2
(45) Date of Patent: Mar. 27, 2007

(54) METAL-SUBSTITUTED TRANSISTOR GATES

(75) Inventors: Leonard Forbes, Corvallis, OR (US); Paul A. Farrar, Bluffton, SC (US); Kie Y. Ahn, Chappaqua, NY (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 11/176,738

(22) Filed: Jul. 7, 2005

(65) Prior Publication Data

US 2007/0010060 A1 Jan. 11, 2007

(51) Int. Cl.
H01L 21/336 (2006.01)

(52) U.S. Cl. ........... 438/585; 428/595; 428/301; 257/288; 257/E21.444

(58) Field of Classification Search ........... 438/585, 438/595, 301; 257/288, E21.444
See application file for complete search history.

(56) References Cited

U.S. PATENT DOCUMENTS

| | | | |
|---|---|---|---|
| 4,745,082 A * | 5/1988 | Kwok | 438/178 |
| 4,994,404 A | 2/1991 | Sheng et al. | |
| 5,341,016 A | 8/1994 | Prall et al. | |
| 5,391,510 A | 2/1995 | Hsu et al. | |
| 5,960,270 A * | 9/1999 | Misra et al. | 438/197 |
| 6,051,486 A * | 4/2000 | Gardner | 438/585 |
| 6,080,646 A * | 6/2000 | Wang | 438/585 |
| 6,083,836 A * | 7/2000 | Rodder | 438/690 |
| 6,492,694 B2 | 12/2002 | Noble et al. | |
| 6,495,436 B2 * | 12/2002 | Ahn et al. | 438/591 |
| 6,500,756 B1 | 12/2002 | Bell et al. | |
| 6,514,828 B2 | 2/2003 | Ahn et al. | |
| 6,534,420 B2 | 3/2003 | Ahn et al. | |
| 6,573,169 B2 * | 6/2003 | Noble et al. | 438/592 |
| 6,605,514 B1 | 8/2003 | Tabery et al. | |
| 6,664,154 B1 * | 12/2003 | Bell et al. | 438/197 |
| 6,727,560 B1 | 4/2004 | Pan et al. | |
| 6,767,795 B2 | 7/2004 | Ahn et al. | |
| 6,790,791 B2 | 9/2004 | Ahn et al. | |
| 6,818,519 B2 | 11/2004 | Fang et al. | |
| 6,844,203 B2 | 1/2005 | Ahn et al. | |
| 6,849,546 B1 | 2/2005 | Tu et al. | |

(Continued)

OTHER PUBLICATIONS

E. Washburn, "International Critical Tables of Numerical Data, Physics, Chemistry and Technology," 2003, vol. 1, pp. 103-105.*

(Continued)

*Primary Examiner*—Bradley K. Smith
*Assistant Examiner*—Steven J. Fulk
(74) *Attorney, Agent, or Firm*—Schwegman, Lundberg, Woessner & Kluth, P.A.

(57) ABSTRACT

One aspect of this disclosure relates to a method for forming a transistor. According to various method embodiments, a gate dielectric is formed on a substrate, a substitutable structure is formed on the gate dielectric, and source/drain regions for the transistor are formed. A desired gate material is substituted for the substitutable structure to provide the desired gate material on the gate dielectric. Some embodiments use carbon for the substitutable material, and some embodiments use silicon, germanium or silicon-germanium for the substitutable material. Some embodiments form a high-k gate dielectric, such as may be formed by an atomic layer deposition process, an evaporated deposition process, and a metal oxidation process. Other aspects and embodiments are provided herein.

61 Claims, 4 Drawing Sheets

U.S. PATENT DOCUMENTS

| | | | |
|---|---|---|---|
| 6,884,739 B2 | 4/2005 | Ahn et al. | |
| 6,893,984 B2 | 5/2005 | Ahn et al. | |
| 6,900,122 B2 | 5/2005 | Ahn et al. | |
| 6,921,702 B2 | 7/2005 | Ahn et al. | |
| 7,033,869 B1* | 4/2006 | Xiang et al. | 438/149 |
| 2001/0003667 A1* | 6/2001 | Ahn et al. | 438/344 |
| 2002/0192974 A1 | 12/2002 | Ahn et al. | |
| 2003/0043637 A1 | 3/2003 | Forbes et al. | |
| 2003/0045060 A1* | 3/2003 | Ahn et al. | 438/287 |
| 2003/0045078 A1 | 3/2003 | Ahn et al. | |
| 2003/0119246 A1* | 6/2003 | Ahn et al. | 438/216 |
| 2003/0119291 A1* | 6/2003 | Ahn et al. | 438/591 |
| 2003/0132491 A1* | 7/2003 | Ahn et al. | 257/411 |
| 2003/0157764 A1* | 8/2003 | Ahn et al. | 438/212 |
| 2003/0207032 A1 | 11/2003 | Ahn et al. | |
| 2003/0207540 A1 | 11/2003 | Ahn et al. | |
| 2003/0227033 A1 | 12/2003 | Ahn et al. | |
| 2003/0228747 A1* | 12/2003 | Ahn et al. | 438/591 |
| 2004/0023461 A1* | 2/2004 | Ahn et al. | 438/287 |
| 2004/0033701 A1* | 2/2004 | Ahn et al. | 438/785 |
| 2004/0038554 A1* | 2/2004 | Ahn et al. | 438/778 |
| 2004/0043541 A1 | 3/2004 | Ahn | |
| 2004/0043569 A1 | 3/2004 | Ahn | |
| 2004/0110348 A1* | 6/2004 | Ahn et al. | 438/287 |
| 2004/0110391 A1 | 6/2004 | Ahn et al. | |
| 2004/0142546 A1* | 7/2004 | Kudo et al. | 438/585 |
| 2004/0144980 A1 | 7/2004 | Ahn et al. | |
| 2004/0175882 A1 | 9/2004 | Ahn et al. | |
| 2004/0175910 A1* | 9/2004 | Pan et al. | 438/592 |
| 2004/0214399 A1 | 10/2004 | Ahn et al. | |
| 2004/0262700 A1 | 12/2004 | Ahn et al. | |
| 2005/0020017 A1 | 1/2005 | Ahn et al. | |
| 2005/0051854 A1* | 3/2005 | Cabral et al. | 257/407 |
| 2005/0054165 A1 | 3/2005 | Ahn et al. | |
| 2005/0077519 A1 | 4/2005 | Ahn et al. | |
| 2005/0145894 A1 | 7/2005 | Chau et al. | |
| 2005/0272191 A1 | 12/2005 | Shah et al. | |

OTHER PUBLICATIONS

Ahn, Kie Y., et al., "ALD of Amorphous Lanthanide Doped Tiox Films", *U.S. Appl. No. 11/092,072, filed Mar. 29, 2005*.

Ahn, Kie Y., et al., "Atomic Layer Deposited Hafnium Tantalum Oxide Dielectrics", *U.S. Appl. No. 11/029,757, filed Jan. 5, 2005*.

Ahn, Kie Y., et al., "Atomic Layer Deposited Lanthanum Aluminum Oxide Dielectric Layer", *U.S. Appl. No. 10/930,167, filed Aug. 31, 2004*.

Ahn, Kie Y., et al., "Atomic Layer Deposited Lanthanum Hafnium Oxide Dielectrics", *U.S. Appl. No. 11/010,529, filed Dec. 13, 2004*.

Ahn, Kie Y., et al., "Atomic Layer Deposited Titanium Aluminum Oxide Films", *U.S. Appl. No. 10/931,533, filed Aug. 31, 2004*.

Ahn, Kie Y., et al., "Atomic Layer Deposition of Hf3N4/HfO2 Films as Gate Dielectrics", *U.S. Appl. No. 11/063,717, filed Feb. 23, 2005*.

Ahn, Kie Y., et al., "Atomic Layer Deposition of Zirconium-Doped Tantalum Oxide Films", *U.S. Appl. No. 10/909,959, filed Aug. 2, 2004*.

Ahn, Kie Y., et al., "Atomic Layer Deposition of Zr3N4/ZrO2 Films as Gate Dielectrics", *U.S. Appl. No. 11/058,563, filed Feb. 15, 2005*.

Ahn, Kie Y., et al., "Hybrid ALD-CVD of PrXOY/ZrO2 Films as Gate Dielectrics", *U.S. Appl. No. 11/010,766, filed Dec. 13, 2004*.

Ahn, Kie Y., et al., "Ruthenium Gate for a Lanthanide Oxide Dielectric Layer", *U.S. Appl. No. 10/926,812, filed Aug. 26, 2004*.

Fastow, R., et al., "Eutectic melting by pulsed ion beam irradiation", *Applied Physics Letters*, vol. 46, No. 11, (Jun. 1985), 1052-1054.

Harrison, S., et al., "Poly-gate REplacement Through Contact Hold (PRETCH): A new method for High-K/Metal gate and multi-oxide implementation on chip", *IEEE Int. Electron Devices Meeting, Paper 12.2*, San Francisco,(Dec. 2004), 4 pages.

Horie, Hiroshi, et al., "Novel High Aspect Ratio Aluminum Plug for Logic/DRAM LSI's Using Polysilicon-Aluminum Substitute", *Technical Digest: IEEE International Electron Devices Meeting*, San Francisco, CA, (1996), 946-948.

Park, Chang S., et al., "MOS Characteristics of Substituted Al Gate on High-K Dielectric", *IEEE Electron Device Letters*, vol. 25, No. 11, (Nov. 2004), 725-27.

Berezhnoi, A., *Silicon and its Binary Systems*, Consultants Bureau, New York,(1960),84.

Compagnini, G., et al., "Spectroscopic Characterization of Annealed $Si_{1-x}C_x$ Films", *J. Materials Res.*, 11, (Sep. 1996),2269-2273.

Huff, H. R., "High Dielectric Constant Materials", *Springer*, (2005), 261-266.

* cited by examiner a
METAL-SUBSTITUTED TRANSISTOR GATES

TECHNICAL FIELD

This disclosure relates generally to integrated circuits, and more particularly, to transistor structures and methods of formation.

BACKGROUND

Many integrated circuits include a metal-oxide-semiconductor, field-effect transistor, or "MOSFET" for short, which includes a gate, a source, a drain, and a body. An issue in MOSFET design involves the structure and composition of its gate. Some early MOSFET designs included aluminum gates, and later MOSFET designs used polysilicon gates because of the desire for a self-aligned gate as well as the tendency of aluminum to diffuse through the underlying insulative layer and also because of problems that the relatively low melting temperature of aluminum caused with annealing processes. Polysilicon can be doped to act as a conductor, but with significantly more electrical resistance than aluminum. This higher resistance can be ameliorated somewhat by silicidation. However, the higher resistance of even the salicided polysilicon gates combines with inherent integrated-circuit capacitances to cause significant delays in conducting signals from one circuit point to another, ultimately limiting how fast integrated circuits operate.

Currently, the semiconductor industry relies on the ability to reduce or scale the dimensions of its basic devices, including the gate dielectric, of its transistor devices to obtain lower power consumption and higher performance. To reduce transistor size, the thickness of the gate dielectric is reduced in proportion to the shrinkage of the gate length. Increased scaling and other requirements in microelectronic devices have created the need to use other dielectric materials as gate dielectrics, in particular dielectrics with higher dielectric constants (k) to replace the conventional use of various combinations of $SiO_2$, $Si_3N_4$ and SiON. Practical higher dielectric constant (k) materials have the properties of high permittivity, thermal stability, high film and surface quality and smoothness, low hysteresis characteristics, low leakage current density, and long term reliability. However, polysilicon gates and high-k dielectric materials have interface instability issues.

SUMMARY

One aspect of this disclosure relates to a method for forming a transistor. According to various method embodiments, a gate dielectric is formed on a substrate, a substitutable structure is formed on the gate dielectric, and source/drain regions for the transistor are formed. A desired gate material is substituted for the starting or substitutable structure to provide the desired gate material on the gate dielectric. Some embodiments use carbon for the substitutable material. Various embodiments replace carbon starting material with gold (Au), silver (Ag), gold alloy, silver alloy, copper (Cu), platinum (Pt), rhenium (Re), ruthenium (Ru), rhodium (Rh), nickel (Ni), osmium (Os), palladium (Pd), iridium (Ir), cobalt (Co), and germanium (Ge). Some embodiments use silicon, germanium or silicon-germanium for the starting or substitutable material. Various embodiments replace silicon, germanium or silicon-germanium starting material with aluminum, copper, silver, gold, alloys of silver, or alloys of gold. Some embodiments form a high-k gate dielectric, such as may be formed by an atomic layer deposition process, an evaporated deposition process, and a metal oxidation process. According to various embodiments, the high-k gate dielectric includes one or more of the following: $AlO_x$, $LaAlO_3$, $HfAlO_3$, $Pr_2O_3$-based lanthanide oxide, HfSiON, Zr—Sn—Ti—O, ZrON, $HFO_2$/Hf, $ZrAl_xO_y$, $ZrTiO_4$, Zr-doped Ta, $HfO_2$—$Si_3N_4$, lanthanide oxide, $TiAlO_x$, $LaAlO_x$, $La_2Hf_2O_7$, HfTaO amorphous lanthanide doped TiOx, $TiO_2$, $HfO_2$, $CoTiO_3$, $ZrO_2$, $Y_2O_3$, $Gd_2O_3$, praseodymium oxide, amorphous $ZrO_xN_y$, Y—Si—O, $LaAlO_3$, amorphous lanthanide-doped $TiO_x$, $HfO_2$/$La_2O_3$ nanolaminates, $La_2O_3$/$Hf_2O_3$ nanolaminates, $HfO_2$/$ZrO_2$ nanolaminates, lanthanide oxide/zirconium oxide nanolaminates, lanthanide oxide/hafnium oxide nanolaminates, $TiO_2$/$CeO_2$ nanolaminates, $PrO_x$/$ZrO_2$ nanolaminates, $Hf_3N_4$/$HfO_2$ nanolaminates, and $Zr_3N_4$/$ZrO_2$ nanolaminates. Other aspects and embodiments are provided herein.

This summary is an overview of some of the teachings of the present application and is not intended to be an exclusive or exhaustive treatment of the present subject matter. Further details are found in the detailed description and appended claims. Other aspects will be apparent to persons skilled in the art upon reading and understanding the following detailed description and viewing the drawings that form a part thereof, each of which are not to be taken in a limiting sense. The scope of the present invention is defined by the appended claims and their legal equivalents.

DETAILED DESCRIPTION

Figure 1A:
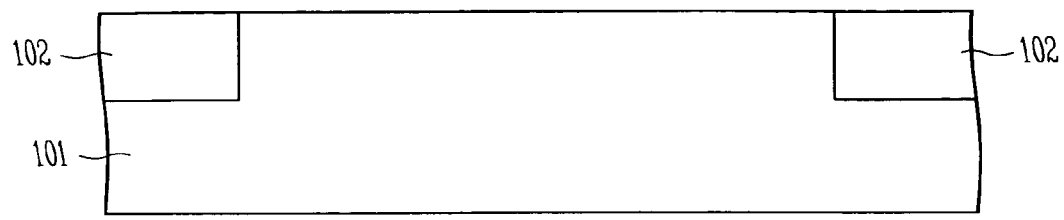
FIGS. 1A–1E illustrate a process for forming a metal substituted gate for a transistor structure, according to various embodiments of the present subject matter.

The following detailed description refers to the accompanying drawings which show, by way of illustration, specific aspects and embodiments in which the present invention may be practiced. The various embodiments are not necessarily mutually exclusive, as aspects of one embodiment can be combined with aspects of another embodiment. Other embodiments may be utilized and structural, logical, and electrical changes may be made without departing from the scope of the present invention. In the following description, the terms wafer and substrate are used interchangeably to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art. The terms "horizontal" and "vertical", as well as prepositions such as "on", "over" and "under" are used in relation to the conventional plane or surface of a wafer or substrate, regardless of the orientation of the wafer or substrate. References to "an", "one", or "various" embodiments in this disclosure are not necessarily to the same embodiment, and such references contemplate more than one embodiment. The following detailed description is, therefore, not to be taken in a limiting sense, and the scope of the present invention is defined only by the appended claims, along with the full scope of equivalents to which such claims are entitled.

Disclosed herein, among other things, is a transistor device structure with substituted metal gates. Various embodiments provide the substituted metal gates over and in contact with a high-k dielectric. Those of skill in the art will understand that the term high-k dielectric refers to a dielectric material having a dielectric constant greater than that of silicon dioxide. That is, a high-k dielectric has a dielectric constant greater than 4. A transistor device structure with a high-k gate dielectric and a substituted metal gate increases the capacitance and reduces the resistance of integrated circuits, which is useful for nanoscale integrated circuits. Additionally, the transistor device disclosed herein is capable of being manufactured with gates engineered to have differing work functions. Thus, in CMOS designs, a transistor metal gate is able to provide a desired work function (within 0.2 eV of the $E_C$ of silicon) for NMOS devices and a desired work function (within 0.2 eV of the $E_V$ of silicon) for PMOS devices.

The substituted metal gates replace a substitutable material formed on a gate dielectric. Various embodiments provide a substituted gate where the starting material is a mixture of silicon and germanium over the entire range of silicon and germanium from 0 to 100 percent silicon. Various embodiments replace the silicon, germanium or silicon-germanium starting material with aluminum, copper, silver, gold, alloys of silver, or alloys of gold. As the silicon-germanium phase relationship is one of a continuous series of solid solutions, the metal substitution of aluminum, silver or gold will work with all mixtures of silicon and germanium. Various embodiments provide a substituted gate where the starting material is carbon. Various embodiments replace the carbon starting material with gold (Au), silver (Ag), gold alloy, silver alloy, copper (Cu), platinum (Pt), rhenium (Re), ruthenium (Ru), rhodium (Rh), nickel (Ni), osmium (Os), palladium (Pd), iridium (Ir), cobalt (Co), and germanium (Ge).

Gold and silver may be substituted for carbon. However, gold and silver are not able to be substituted for all ranges of carbon-silicon or carbon-germanium alloys. Carbon and germanium are not soluble, such that the solid phase is a two phase material. The melting point of carbon (3828° C.) is much higher than that of germanium (938° C.). Thus, alloys with significant amounts of carbon may provide a problem. Silicon and carbon are insoluble and have an intermetallic compound SiC (silicon carbide) as it forms peritectoidly at 2545° C., while the eutectic temperature between silicon and silicon carbide is at 1404° C. Thus, it appears unlikely that one could replace silicon carbide in a silicon rich starting material. However, in a carbon rich silicon carbide material that is properly formed, the temperature of the material could be raised to just under 2545° C. without forming a liquid phase. Thus, it appears that an alloy having above 50 atomic percent carbon is a possible candidate.

Various embodiments provide the substituted gate on a high-k dielectric, such as $AlO_X$, $LaAlO_3$, $HfAlO_3$, $Pr_2O_3$-based lanthanide oxide, HfSiON, Zr—Sn—Ti—O, ZrON, $HfO_2/Hf$, $ZrAl_XO_Y$, $ZrTiO_4$, Zr-doped Ta, $HfO_2$—$Si_3N_4$, lanthanide oxide, $TiAlO_X$, $LaAlO_X$, $La_2Hf_2O_7$, HfTaO amorphous lanthanide doped TiOx, $TiO_2$, $HfO_2$, $CoTiO_3$, $ZrO_2$, $Y_2O_3$, $Gd_2O_3$, praseodymium oxide, amorphous $ZrO_XN_Y$, Y—Si—O, $LaAlO_3$, amorphous lanthanide-doped $TiO_X$, $HfO_2/La_2O_3$ nanolaminates, $La_2O_3/Hf_2O_3$ nanolaminates, $HfO_2/ZrO_2$ nanolaminates, lanthanide oxide/zirconium oxide nanolaminates, lanthanide oxide/hafnium oxide nanolaminates, $TiO_2/CeO_2$ nanolaminates, $PrO_X/ZrO_2$ nanolaminates, $Hf_3N_4/HfO_2$ nanolaminates, and $Zr_3N_4/ZrO_2$ nanolaminates.

Device Structure

FIGS. 1A–1E illustrate a process for forming a metal substituted gate for a transistor structure, according to various embodiments of the present subject matter. FIG. 1A illustrates a substrate 101 and shallow trench isolation (STI) regions 102. The substrate 101 can be a semiconductor wafer as well as structures having one or more insulative, semi-insulative, conductive, or semiconductive layers and materials. Thus, for example, the substrate can include silicon-on-insulator, silicon-on-sapphire, and other structures upon which semiconductor devices are formed.

Figure 1B:
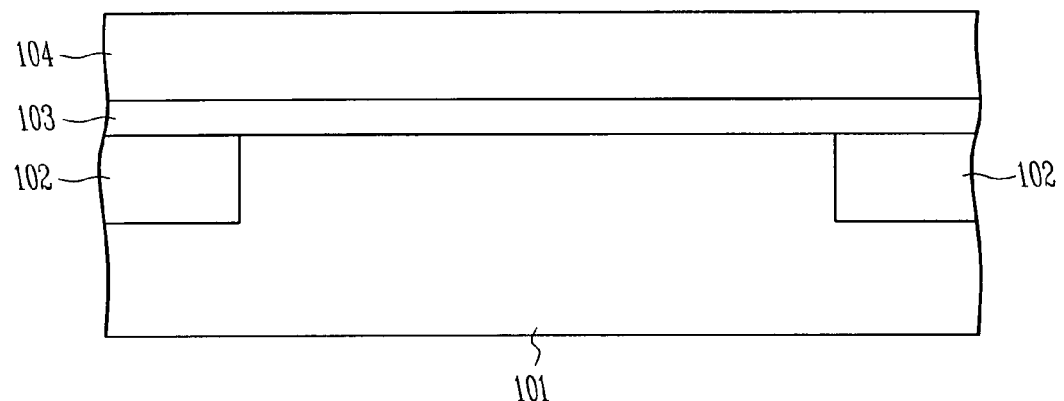

FIG. 1B further illustrates a gate dielectric layer 103 formed on the substrate 101, and a gate substitutable layer 104 formed on the gate dielectric layer 103. According to some embodiments, the gate dielectric layer includes a silicon oxide, such as silicon dioxide. In various embodiments, the gate dielectric layer includes a high-k dielectric, such as $AlO_X$, $LaAlO_3$, $HfAlO_3$, $Pr_2O_3$-based Lanthanide Oxide, HfSiON, Zr—Sn—Ti—O, ZrON, $HfO_2/Hf$, $ZrAl_XO_Y$, $ZrTiO_4$, ZR-doped Ta, $HfO_2$—$Si_3N_4$, lanthanide oxide, $TiAlO_X$, $LaAlO_X$, $La_2Hf_2O_7$, HfTaO amorphous lanthanide doped TiOx, $TiO_2$, $HfO_2$, $CoTiO_3$, $ZrO_2$, $Y_2O_3$, $Gd_2O_3$, praseodymium oxide, amorphous $ZrO_XN_Y$, Y—Si—O, $LaAlO_3$, amorphous lanthanide-doped $TiO_X$, $HfO_2/La_2O_3$ nanolaminates, $La_2O_3/Hf_2O_3$ nanolaminates, $HfO_2/ZrO_2$ nanolaminates, lanthanide oxide/zirconium oxide nanolaminates, lanthanide oxide/hafnium oxide nanolaminates, $TiO_2/CeO_2$ nanolaminates, $PrO_X/ZrO_2$ nanolaminates, $Hf_3N_4/HfO_2$ nanolaminates, $Zr_3N_4/ZrO_2$ nanolaminates, and the like. The use of the high-k dielectric increases the capacitance, which is useful for nanoscale integrated circuits. As will be described in more detail below, the material of the gate substitutable layer 104 is selected with respect to the desired gate material, to allow the gate material to replace the gate substitutable layer to form a gate of the desired gate metal where the substitutable material was positioned on the gate dielectric.

Figure 1C:
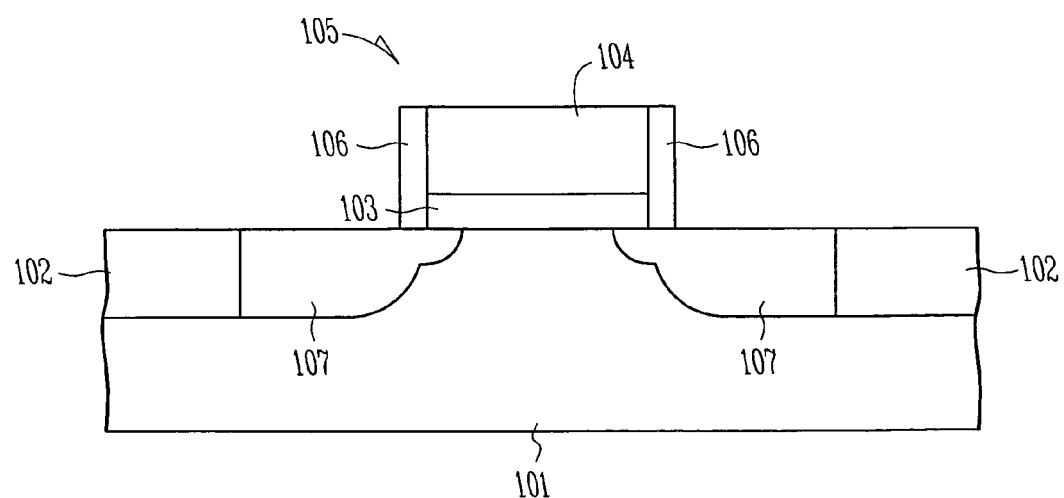

As illustrated in FIG. 1C, portions of the gate dielectric layer 103 and the gate substitutable layer 104 are removed to define a gate 105, and sidewalls or spacers 106 are formed along the gate 105. Source/drain regions are also formed. The source/drain regions 107 can be formed using conventional ion implantation and subsequent annealing. These annealing temperatures can pose problems for aluminum gates and other metal gates that have melting temperatures less than the anneal temperature for the source/drain regions.

Figure 1D:
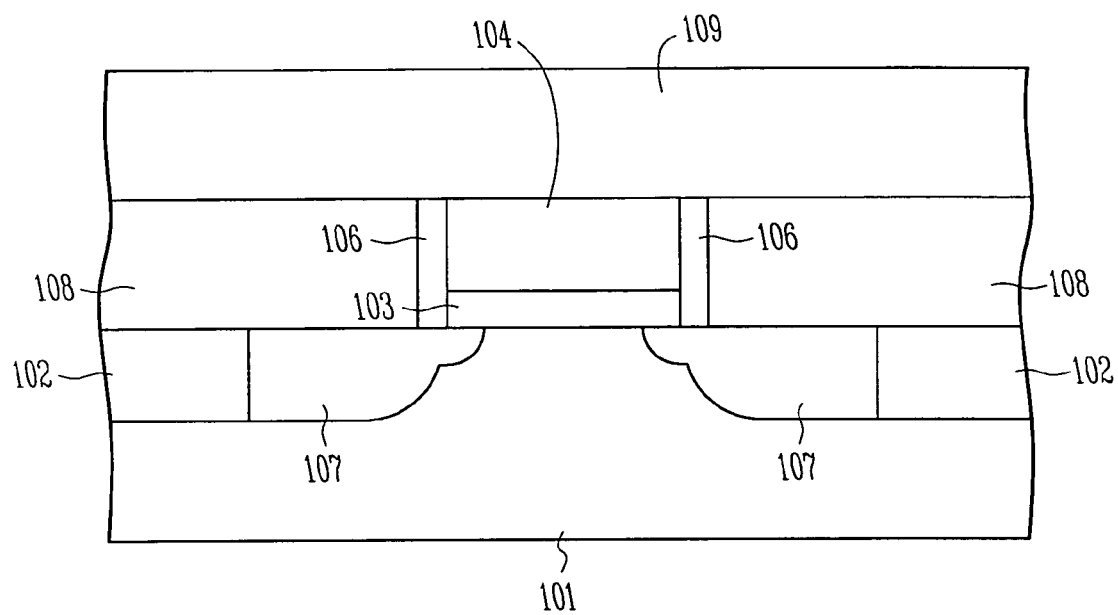

With reference to FIG. 1D, an insulative fill layer 108 is provided to match the thickness of the gate stack. A planarization procedure, such as chemical-mechanical polishing, can be used to provide an even surface across the fill layer 108 and the gate substitutable layer 104. A metal layer 109 formed of material intended to be the gate material is deposited over the gate substitutable layer 104 and the fill layer 108. The metal layer 109 is also referred to herein as a layer of gate material. Various deposition processes, such as evaporation, sputtering or chemical vapor deposition, may be used to form the metal layer 109. The volume of layer 109 is significantly larger than the volume of the substitutable material left on the wafer.

After the metal layer 109 is deposited on the gate substitutable layer, a metal-substitution reaction is induced. The reaction can be provided by annealing the structure in a non-oxidizing atmosphere such as a nitrogen gas or a forming gas. The heating urges diffusion or dissolution of the intended gate material in metal layer 109 for the substitutable material 104. The substitution process is bounded by the spacers 106 and the gate dielectric 103.

Figure 1E:
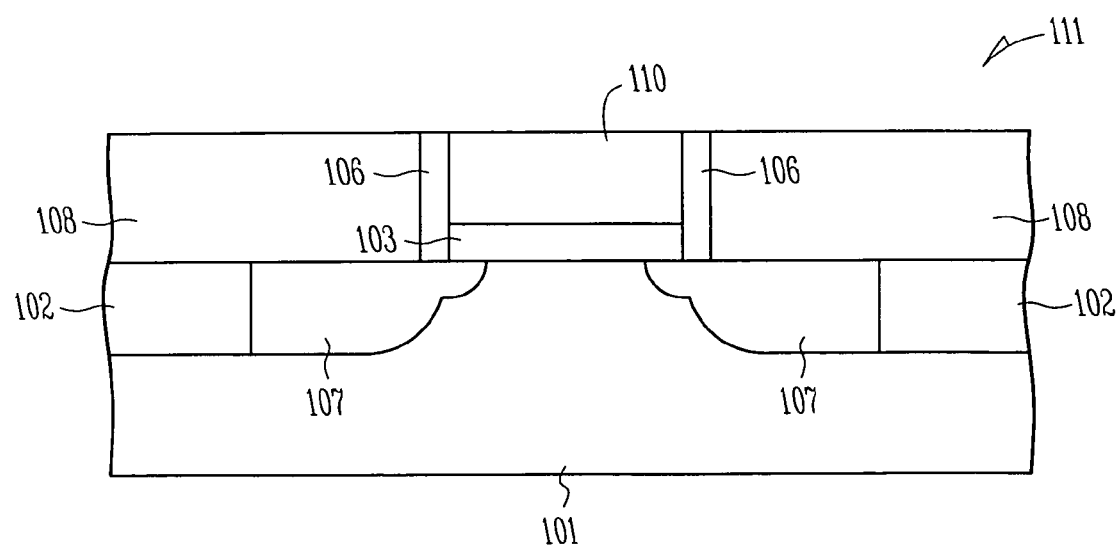

At the conclusion of the substitution reaction, the method removes the residual metal of layer 109 and the substitutable material, such as may be achieved using conventional planarization. FIG. 1E shows the resulting low-resistance gate structure. The illustrated structure includes a metal substituted gate 110 formed by the substitution of the metal of layer 109. The metal substituted gate 110 may include a small amount of the gate substitutable material which did not diffuse above the planarization level 111. Such small amounts of the gate substitutable material do not significantly affect the conductivity of the metal substituted gate 110, and thus do not significantly affect the performance of the device.

Drain and source contacts (not shown) can be formed, as well as interconnects to other transistors or components, using conventional techniques. Another heat treatment may occur after packaging the integrated circuit in a protective housing in an attempt to minimize the resistivity of the metal gate contacts and other metal interconnections.

The metal gate substitution technique, as disclosed herein, can be applied to MOS devices, as generally illustrated in FIG. 1, as well as to form metal floating gates and/or metal control gates in nonvolatile devices. Additionally, various high-k dielectrics can be used between the floating gate and the substrate, and between the control gate and the floating gate in these nonvolatile devices.

Metal Gate Substitution Technique

Figure 2:
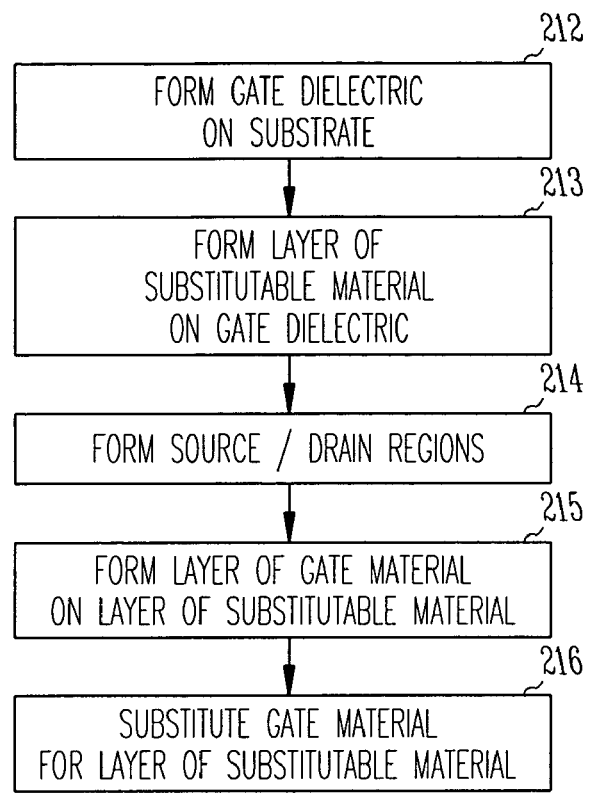
FIG. 2 illustrates an embodiment of a metal gate substitution technique.

FIG. 2 illustrates an embodiment of a metal gate substitution technique. At 212, a gate dielectric is formed on a substrate. The gate dielectric includes a high-k dielectric in some embodiments. Various high-k dielectric embodiments are identified below. At 213, a layer of gate substitutable material is formed on the gate dielectric. Examples of gate substitutable material include polysilicon, germanium, silicon-germanium and carbon. At 214, source/drain regions are formed. A layer of gate material, also referred to herein as a metal layer, is formed at 215 on the gate substitutable material. Examples of such metals include gold, silver, and aluminum. Other metals may be used. At 216, the gate material is substituted for the layer of gate substitutable material.

A metal substitution reaction substitutes or replaces the substitutable material (e.g. silicon, germanium, silicon-germanium, carbon) with a metal. After the substitution, the resulting gate structure includes substantially all of the desired metal. Small amounts of the substitutable material may remain in the gate structure. The substitution reaction can be induced by heating the integrated circuit assembly to a desired temperature in a vacuum, nitrogen, argon, forming gas or other nonoxidizing atmosphere. Heating causes diffusion of the metal layer 109 into the substitutable layer. The annealing temperature for the substitution is less than the eutectic (lowest melting) temperature of materials involved in the substitution for the reaction for substitution to occur. For example, to form a gold gate, one could form the metal layer from gold and anneal at approximately 300° C. to substitute the gold for a silicon substitutable structure, and to form a silver gate one could form the metal layer from silver and anneal at approximately 500–600° C. to substitute the silver for the silicon substitutable structure. A polysilicon and germanium substitutable material can be used, which reduces the anneal temperature.

According to various embodiments, the gate substitutable material 104 shown in FIGS. 1A–1E includes polysilicon. In some embodiments, the gate substitutable material includes germanium. Some embodiments use silicon-germanium, with any percentage of silicon in the range of 0% to 100% as the gate substitutable material 104. Some embodiments use carbon as the gate substitutable material 104.

With respect to embodiments which use polysilicon, germanium or silicon-germanium as the gate substitutable material 104, some embodiments use aluminum as the replacement metal for the substituted gate, some embodiments use silver as the replacement metal, some embodiments use gold as the replacement metal, some embodiments use an alloy of silver as the replacement metal, and some embodiments use an alloy of gold as the replacement metal.

With respect to embodiments which use carbon as the gate substitutable material 104, some embodiment use gold as the replacement metal for the substituted gate, some embodiments use silver as the replacement metal, some embodiments use an alloy of gold as the replacement metal, some embodiments use an alloy of silver as the replacement metal, some embodiments use copper as the replacement metal, some embodiments use platinum as the replacement metal, some embodiments use rhenium as the replacement metal, some embodiments use ruthenium as the replacement metal, some embodiments use rhodium as the replacement metal, some embodiments use nickel as the replacement metal, some embodiments use osmium as the replacement metal, some embodiments use palladium as the replacement metal, some embodiments use iridium as the replacement metal, some embodiments use cobalt as the replacement metal, and some embodiments use germanium as the replacement metal.

Table 1 provides a listing of various embodiments for substituted metal gates formed using various substitutable or starting material and various metal gate material. Table 1 also identifies the eutectic (lowest melting) temperature of the elements, including both the substitutable material and the metal gate material, involved in the substitution process, and the approximate ranges of annealing temperatures that are used in various method embodiments to perform the metal substitution reaction. The identified substitution temperatures are approximate, as they depend on process control tolerances and the effect of impurities. Substitution may occur at other temperatures than that provided as an example in the table.

TABLE 1

| SUBSTITUTABLE MATERIAL | GATE MATERIAL | APPROXIMATE EUTECTIC TEMPERATURE ° C. | APPROXIMATE SUBSTITUTION TEMPERATURE RANGE ° C. |
|---|---|---|---|
| Silicon | Aluminum | 577 | 450–525 |
|  | Silver | 835 | 700–800 |
|  | Gold | 363 | 250–325 |
|  | Alloys of Silver | * | ** |
|  | Alloys of Gold | * | ** |

TABLE 1-continued

| SUB-STITUTABLE MATERIAL | GATE MATERIAL | APPROXIMATE EUTECTIC TEMPERATURE ° C. | APPROXIMATE SUBSTITUTION TEMPERATURE RANGE ° C. |
|---|---|---|---|
| Germanium | Aluminum | 420 | 275–325 |
| | Silver | 653 | 500–600 |
| | Gold | 361 | 250–325 |
| | Alloys of Silver | * | ** |
| | Alloys of Gold | * | ** |
| Silicon-Germanium | Aluminum | <420* | 300–375** |
| | Silver | <653* | 475–575** |
| | Gold | <361* | 250–300** |
| | Alloys of Silver | * | ** |
| | Alloys of Gold | * | ** |
| Carbon | Gold | 1060 | 925–1025 |
| | Silver*** | 962 | 825–925 |
| | Alloys of Gold | * | ** |
| | Alloys of Silver | * | ** |
| | Copper*** | 1100 | 900–1025 |
| | Platinum | 1705 | 1500–1625 |
| | Rhenium | 2505 | 2300–2450 |
| | Ruthenium | 1940 | 1775–1875 |
| | Rhodium | 1694 | 1525–1625 |
| | Nickel | 1326 | 1150–1275 |
| | Osmium | 2732 | 2400–2600 |
| | Palladium | 1504 | 1300–1425 |
| | Iridium | 2296 | 2050–2200 |
| | Cobalt | 1320 | 1150–1275 |
| | Germanium | 938 | 775–875 |

*Ternary diagrams (e.g. Si-Ge-Al phase diagram; Si-Ge-Ag phase diagram; Si-Ge-Au phase diagram) can be used to determine these eutectic temperatures. With respect to the Si-Ge system, silicon and germanium are completely soluble in each other in the solid phase. Thus, there is a possibility that there is a lower melting point in the ternary system than in the binary systems.
**The substitution temperature of ternary systems, as well as the other systems provided herein, can be established by estimating the substitution temperature based on the constituent elements and/or by experiment. The allowance for the effect of any impurities present as well as process control tolerances.
***Carbon-Silver and Carbon-Copper systems are shallow pertectic systems, rather than eutectic systems. It is believed that such shallow pertectic systems can be used to provide the metal gate substitution process.

Various embodiments form an integrated circuit structure using two or more substitution reactions. Relatively higher temperature substitution processes can be performed before relatively lower temperature substitution processes. For example, a relatively high-temperature substitution reaction with carbon can be performed before a relatively low-temperature substitution reaction with germanium. Examples of substitution temperature ranges are provided above in Table 1. The present subject matter includes multiple substitution reactions involving various combinations of two or more substitution processes illustrated in Table 1. One application for multiple substitution reactions is to independently adjust work functions of NMOS and PMOS transistors in CMOS integrated circuits. Multiple substitution reactions are not limited to this CMOS integrated circuit application.

High-k Dielectric Gate Insulator

As provided above, some embodiments provide the metal substituted gate 110 on a high-k gate dielectric 103. Various embodiments use the specific high-k dielectrics provided below. Some specific process examples are provided below for the identified high-k dielectric. These process examples are not intended to be limited to exclude the identified device structures if the structures are formed using other processes. According to various embodiments, a high-k dielectric can be fabricated using atomic layer deposition (ALD) processes, evaporated deposition processes, and sputtered deposition processes. Additionally, metal can be oxidized to form a high-k dielectric, and the high-k dielectric can be formed as nanolaminates of dielectric material.

Specific chemical formulas are referenced below with respect to various high-k dielectric structures. However, the dielectric structure can include stoichiometric structures, non-stoichiometric structures, and combinations of stoichiometric and non-stoichiometric structures.

$AlO_X$

Various embodiments use an aluminum oxide ($AlO_X$) formed by ALD as a high-k dielectric. For example, a pulse of an oxidant can be provided, followed by a purge or evacuation of the oxidant, followed by a pulse of a precursor containing aluminum, followed by a purge or evacuation of the aluminum-containing precursor. The aluminum precursor can include a variety of precursors, such as trimethylaluminum (TMA), trisobutylaluminum (TIBA), dimethylaluminum hydride (DMAH), $AlC_3$, and other halogenated precursors and organometallic precursors. Oxidants can include a water-argon mixture formed by bubbling an argon carrier through a water reservoir, $H_2O_2$, $O_2$, $O_3$, and $N_2O$. The ALD aluminum oxides are not limited to specific aluminum precursors or oxidants. Additional information regarding aluminum oxides formed by ALD can be found in US Patent Application Publication 20030207032A1, entitled "Methods, Systems, and Apparatus for Atomic-Layer Deposition of Aluminum Oxides in Integrated Circuits," which is herein incorporated by reference.

$LaAlO_3$

Various embodiments use a lanthanum aluminum oxide ($LaAlO_3$) formed by ALD as a high-k dielectric. For example, a $LaAlO_3$ gate dielectric can be formed using atomic layer deposition by employing a lanthanum sequence and an aluminum sequence, where the lanthanum sequence uses $La(thd)_3$ (thd=2,2,6,6-tetramethyl-3,5-heptanedione) and ozone, and the aluminum sequence uses either trimethylaluminum, $Al(CH_3)_3$, or DMEAA, an adduct of alane ($AlH_3$) and dimethylethylamine [$N(CH_3)_2(C_2H_5)$], with distilled water vapor.

A dielectric film containing $LaAlO_3$, $Al_2O_3$, and $La_2O_3$ will have a dielectric constant ranging from the dielectric constant of $Al_2O_3$, 9, to the dielectric constant of $La_2O_3$, 30. By controlling the number of cycles of the lanthanum sequence and the number of cycles of the aluminum sequence, the amount of lanthanum and aluminum deposited on the surface region of a substrate can be controlled. Thus, a dielectric film formed by ALD using a lanthanum sequence and an aluminum sequence can be formed with a composition containing selected or predetermined percentages of $LaAlO_3$, $Al_2O_3$, and $La_2O_3$, in which case the effective dielectric constant of the film will be selected or predetermined in the range from 9 to 30. A dielectric film containing almost entirely $LaAlO_3$ will have a dielectric constant in the range of about 21 to about 25. The resulting dielectric containing $LaAlO_3$ should be amorphous if an aluminum sequence is used subsequent to a lanthanum sequence.

In addition to separately controlling the number of cycles of the lanthanum sequence and the aluminum sequence in the ALD process, a dielectric film containing $LaAlO_3$ can be engineered with selected characteristics by also controlling precursor materials for each sequence, processing temperatures and pressures for each sequence, individual precursor pulsing times, and heat treatment at the end of the process, at the end of each cycle, and at the end of each sequence. The heat treatment may include in situ annealing in various atmospheres including argon, nitrogen, and oxygen. A range of equivalent oxide thickness is associated with the capability to provide a composition having a dielectric constant in the range from about 9 to about 30, and the capability to attain physical film thickness in the range from about 0.5 to about 50 nm and above.

Additional information regarding $LaAlO_3$ dielectric films can be found in US Patent Application Publication 20030207540A1, entitled "Atomic Layer-Deposited $LaAlO_3$ Films For Gate Dielectrics," which is herein incorporated by reference.

HfAlO

Various embodiments use a hafnium aluminum oxide ($HfAlO_3$) formed by ALD as a high-k dielectric. For example, an $HfAlO_3$ gate dielectric can be formed using atomic layer deposition by employing a hafnium sequence and an aluminum sequence, where the hafnium sequence uses $HfCl_4$ and water vapor, and the aluminum sequence uses either trimethylaluminum, $Al(CH_3)_3$, or DMEAA, an adduct of alane ($AlH_3$) and dimethylethylamine $[N(CH_3)_2 (C_2H_5)]$, with distilled water vapor.

A dielectric film containing $HfAlO_3$, $Al_2O_3$, and $HfO_2$ has a dielectric constant ranging from the dielectric constant of $Al_2O_3$, 9, to the dielectric constant of $HfO_2$, 25. By controlling the number of cycles of the hafnium sequence and the number of cycles of the aluminum sequence, the amount of haflium and aluminum deposited on the surface region of a substrate can be controlled. Thus, a dielectric film formed by ALD using a hafnium sequence and an aluminum sequence can be formed with a composition containing selected or predetermined percentages of $HfAlO_3$, $Al_2O_3$, and $HfO_2$, in which case the effective dielectric constant of the film will be selected or predetermined in the range from 9 to 25. Furthermore, using an aluminum sequence subsequent to a hafnium sequence, the resulting dielectric containing $HfAlO_3$ should be amorphous.

In addition to separately controlling the number of cycles of the hafnium sequence and the aluminum sequence in the ALD process, a dielectric film containing $HfAlO_3$ can be engineered with selected characteristics by also controlling precursor materials for each sequence, processing temperatures and pressures for each sequence, individual precursor pulsing times, and heat treatment at the end of the process, at the end of each cycle, and at the end of each sequence. The heat treatment may include in situ annealing in various atmospheres including argon and nitrogen.

A range of equivalent oxide thickness, $t_{eq}$ is associated with the capability to provide a composition having a dielectric constant in the range from about 9 to about 25, and the capability to attain physical film thickness in the range of from about 2 to about 3 nm and above.

Additional information regarding $HfAlO_3$ dielectric films can be found in US Patent Application Publication 20030227033A1, entitled "Atomic Layer-Deposited $HfAlO_3$ Films For Gate Dielectrics," which is herein incorporated by reference.

$Pr_2O_3$-Based La-Oxide

Various embodiments use a $Pr_2O_3$-based La-Oxide dielectric as a high-k dielectric. For example, a $Pr_2O_3$-based La-Oxide gate dielectric can be formed by electron beam evaporation as a nanolaminate of $Pr_2O_3$ and a lanthanide oxide selected from the group consisting of $Nd_2O_3$, $Sm_2O_3$, $Gd_2O_3$, and $Dy_2O_3$.

According to one embodiment, an electron gun generates an electron beam that hits a target that contains a ceramic $Pr_6O_{11}$ source, which is evaporated due to the impact of the electron beam. The evaporated material is then distributed throughout a chamber, and a dielectric layer of $Pr_2O_3$ is grown, forming a film on the surface of the structure that it contacts. The resultant $Pr_2O_3$ layer includes a thin amorphous interfacial layer of about 0.5 nm thickness separating a crystalline layer of $Pr_2O_3$ from the substrate on which it is grown. This thin amorphous layer is beneficial in reducing the number of interface charges and eliminating any grain boundary paths for conductance from the substrate. Other source materials can be used for forming the $Pr_2O_3$ layer, as are known to those skilled in the art.

Subsequent to the formation of the $Pr_2O_3$ layer, another lanthanide oxide is deposited on the film, converting the film from a $Pr_2O_3$ layer to a nanolaminate of $Pr_2O_3$ and the other lanthanide oxide. In various embodiments, the other lanthanide oxide is selected from the group consisting of $Nd_2O_3$, $Sm_2O_3$, $Gd_2O_3$, and $Dy_2O_3$. Depending on the lanthanide oxide selected to form the nanolaminate, a corresponding source material is used in the target for electron beam evaporation. The source material for the particular lanthanide oxide is chosen from commercial materials for forming the lanthanide oxide by electron beam evaporation, as is known by those skilled in the art.

In one embodiment, alternating layers of $Pr_2O_3$ and another selected lanthanide oxide are formed by controlled electron beam evaporation providing layers of material of predetermined thickness. This control allows the engineering of a dielectric with a predetermined thickness and composition. Through evaluation of different lanthanide oxides at various thicknesses and number of layers, a dielectric layer with a predetermined $t_{eq}$ in a narrow range of values can be grown. Alternatively, after forming a $Pr_2O_3$ layer and a layer of another lanthanide oxide, additional layers of additional lanthanide oxides can be formed. Each layer of an additional lanthanide oxide selected from a group consisting of $Pr_2O_3$, $Nd_2O_3$, $Sm_2O_3$, $Gd_2O_3$, and $Dy_2O_3$. Consequently, a dielectric layer can be engineered with electrical characteristics suited for a given application. These electrical characteristics include $t_{eq}$ and leakage current. A $t_{eq}$ of less than 20 Å can be obtained, typically with sizes of about 14 Å to 8.5 Å.

In an embodiment, nanolaminates of lanthanide oxides are formed by electron beam evaporation. The lanthanide oxides used in these nanolaminates are chosen from the group consisting of $Pr_2O_3$, $Nd_2O_3$, $Sm_2O_3$, $Gd_2O_3$, and $Dy_2O_3$. The structure of the nanolaminates can be varied with any one of the group used as the initial layer formed on a substrate. Typically, the substrate is silicon based, since these lanthanide oxides are thermodynamically stable with respect to formation on a silicon surface. In an alternate embodiment, lanthanide oxide nanolaminates are formed by atomic layer deposition.

A $Pr_2O_3$ film formed on silicon has a dielectric constant of about 31 when formed with little or no interfacial layer between the $Pr_2O_3$ film and the substrate. The dielectric constants for the other lanthanide oxides are also in the range of 25–30. As a result, a dielectric layer grown by forming a nanolaminate of lanthanide oxides has a dielectric constant in the range of about 25 to about 31. However, with an interfacial layer formed between the surface of the substrate and the first lanthanide oxide, the $t_{eq}$ of the dielectric layer is the $t_{eq}$ of the interfacial layer in parallel with the lanthanide oxide nanolaminate. Thus, the dielectric layer formed having an interfacial layer between the substrate on which it is grown and a lanthanide oxide nanolaminate can have an effective dielectric constant considerably less than a dielectric constant associated with a nanolaminate of lanthanide oxides. This is dependent upon the dielectric constant of the interfacial material being considerably less than the dielectric constant of the lanthanide oxides used to form the nanolaminate.

A $Pr_2O_3$ layer can be formed on a silicon based substrate having a dielectric constant of about 31 with an interfacial layer of about 0.5 nm (5 Å). In another embodiment, for an interfacial layer of about 10.7 Å, an effective dielectric constant for a thin layer of $Pr_2O_3$ on silicon is about 15. Similar effective dielectric constants are associated with thin layers of $Nd_2O_3$, $Sm_2O_3$, $Gd_2O_3$, and $Dy_2O_3$ oxides on silicon. For example, a thin layer of $Nd_2O_3$ has an effective dielectric constant of about 12.9 with an interfacial layer of about 8.2 Å, a thin layer of $Sm_2O_3$ has an effective dielectric constant of about 11.4 with an interfacial layer of about 5.5 Å, a thin layer of $Gd_2O_3$ has an effective dielectric constant of about 13.9 with an interfacial layer of about 10 Å, and a thin layer of $Dy_2O_3$ has an effective dielectric constant of about 14.3 with an interfacial layer of about 12 Å. Lanthanide oxides grown on silicon with these reduced effective dielectric constants and corresponding interfacial layers can be attained with a $t_{eq}$ equal to about 13 Å for $Pr_2O_3$, about 12.4 Å for $Nd_2O_3$, about 12.2 Å for $Sm_2O_3$, about 13 Å for $Gd_2O_3$, and about 13.3 Å for $Dy_2O_3$. Consequently, nanolaminates of these lanthanide oxides can be formed with an effective dielectric constant in the range of 11 to 15 and a $t_{eq}$ in the range of about 12 Å to about 14 Å.

The formation of the interfacial layer is one factor in determining how thin a layer can be grown. An interfacial layer can be $SiO_2$ for many processes forming a non-$SiO_2$ dielectric on a silicon substrate. However, advantageously, in an embodiment forming a lanthanide oxide nanolaminate with an initial layer of $Pr_2O_3$, a thin amorphous interfacial layer is formed that is not a $SiO_2$ layer. Typically, this interfacial layer is either an amorphous layer primarily of $Pr_2O_3$ formed between the silicon substrate and a crystalline form of $Pr_2O_3$, or a layer of Pr—Si—O silicate. The dielectric constant for Pr—Si—O silicate is significantly greater than $SiO_2$, but not as high as $Pr_2O_3$.

Another factor setting a lower limit for the scaling of a dielectric layer is the number of monolayers of the dielectric structure necessary to develop a full band gap such that good insulation is maintained between an underlying silicon layer and an overlying conductive layer on the dielectric layer or film. This requirement is necessary to avoid possible short circuit effects between the underlying silicon layer and the overlying conductive layer used. In one embodiment, for a 0.5 nm interfacial layer and several monolayers of lanthanide grown, an expected lower limit for the physical thickness of a dielectric layer grown by forming a lanthanide oxide nanolaminate is anticipated to be in about the 2–4 nm range. Consequently, typical dielectric layers or films can be grown by forming lanthanide oxide nanolaminates having physical thickness in the range of 4 to 10 nm. The number of layers used, the thickness of each layer, and the lanthanide oxide used for each layer can be engineered to provide the desired electrical characteristics. The use of $Pr_2O_3$ as the initial layer is expected to provide excellent overall results with respect to reliability, current leakage, and ultra-thin $t_{eq}$.

Some embodiments include forming lanthanide oxide nanolaminates by electron beam evaporation with target material to form $Pr_2O_3$, forming lanthanide oxide nanolaminates by atomic layer deposition, and electron beam evaporation forming lanthanide oxide nanolaminates with initial layers of a lanthanide oxide other than $Pr_2O_3$. The physical thicknesses can range from about 2 nm to about 10 nm with typical thickness ranging from about 4 nm to about 10 nm. Such layers have an effective dielectric constant ranging from 11 to 31, where a layer with a typical interfacial layer has an effective dielectric constant in the range of 11 to 16, and a layer with a significantly thin interfacial layer can attain an effective dielectric constant in the range of 25 to 31. Consequently, a range for the equivalent oxide thickness of a dielectric layer formed as a lanthanide oxide nanolaminate can be engineered over a significant range. Various embodiments provide a typical $t_{eq}$ of about 14 Å. With careful preparation and engineering of the lanthanide oxide nanolaminate limiting the size of interfacial regions, a $t_{eq}$ down to 2.5 Å or lower is anticipated.

Additional information regarding $Pr_2O_3$-based La-Oxide dielectric films can be found in US Patent Application Publication 20030228747A1, entitled "$Pr_2O_3$-based La-Oxide Gate Dielectrics," which is herein incorporated by reference.

Lanthanide Doped $TiO_x$

A lanthanide doped $TiO_x$ dielectric layer can be formed by depositing titanium and oxygen onto a substrate surface by atomic layer deposition and depositing a lanthanide dopant by atomic layer deposition onto the substrate surface containing the deposited titanium and oxygen. The dopant can be selected from a group consisting of Nd, Tb, and Dy.

In one embodiment, a method of forming a dielectric film includes depositing titanium and oxygen onto a substrate surface by atomic layer deposition and depositing a lanthanide dopant by atomic layer deposition onto the substrate surface containing the deposited titanium and oxygen. In one embodiment, the titanium sequence and the lanthanide dopant sequence include using precursors that form oxides of the titanium and the lanthanide dopant. For example, precursor $TiI_4$ with $H_2O_2$ as its reactant precursor in an ALD process can form $TiO_x$, and precursor $La(thd)_3$ (thd=2,2,6,6-tetramethyl-3,5-heptanedione) with ozone as its reactant precursor in an ALD process can form $La_2O_3$.

Depositing the lanthanide dopant includes regulating the deposition of the lanthanide dopant relative to the titanium and oxygen deposited on the substrate surface to form a dielectric layer containing $TiO_x$ doped with a predetermined percentage of the lanthanide. In a further embodiment, depositing a lanthanide dopant includes depositing a lanthanide selected from a group consisting of Nd, Tb, and Dy.

The lanthanide dopant can be included in the $TiO_x$ film using different embodiments for atomic layer deposition. In one embodiment, a lanthanide can be doped in the $TiO_x$ film by pulsing a lanthanide dopant sequence in place of a titanium sequence. The lanthanide dopant level is then controlled by regulating the number of cycles of the lanthanide dopant sequence with respect to the number of cycles of the titanium sequence. In another embodiment, a lanthanide can be doped in the $TiO_x$ film by pulsing a lanthanide dopant precursor substantially simultaneously with a titanium precursor. The titanium/lanthanide dopant sequence includes a precursor for oxidizing the titanium/lanthanide dopant at the substrate surface. The lanthanide dopant level is then controlled by regulating the mixture of the titanium-containing precursor and the lanthanide-containing precursor.

Dielectric films of lanthanide doped $TiO_x$ formed by atomic layer deposition can provide not only ultra thin $t_{eq}$ films, but also films with relatively low leakage current. In addition to using ALD to provide precisely engineered film thicknesses, attainment of relatively low leakage current is engineered by doping with lanthanides selected from a group consisting of Nd, Tb, and Dy. Though a layer of undoped $TiO_x$ can be amorphous, which assists the reduction of leakage current, doping with these lanthanides yields a doped amorphous $TiO_x$ with enhanced leakage current characteristics. Leakage currents on the order of $10^{-7}$ A/cm$^2$ or smaller in $TiO_x$ layers doped with Nd, Tb, or Dy can be attained, which are orders of magnitude smaller than for undoped $TiO_x$. Further, the breakdown electric fields are several factors larger for layers of $TiO_x$ doped with Nd, Tb, or Dy than for layers of undoped $TiO_x$.

The doping of the $TiO_x$ layer with a lanthanide occurs as a substitution of a lanthanide atom for a Ti atom. The resultant doped $TiO_x$ layer is a layer of amorphous $Ti_{1-y}L_yO_x$, where L is a lanthanide. Controlling the ALD cycles of the titanium sequence and the lanthanide dopant sequence allows a $Ti_{1-y}L_yO_x$, or lanthanide doped $TiO_x$, dielectric layer to be formed where the lanthanide, L, can range from about 5% to about 40% of the dielectric layer formed. Such $TiO_x$ layers doped with Nd, Tb, or Dy formed by ALD can provide the reduced leakage current and increased breakdown mentioned above.

Additional information regarding lanthanide doped $TiO_x$ dielectric films can be found in US Patent Application Publication 2004/0043541A1, entitled "Atomic Layer Deposited Lanthanide Doped $TiO_x$ Dielectric Films," which is herein incorporated by reference.

HfSiON

A HfSiON dielectric can be formed by atomic layer deposition. A HfSiON layer thickness is controlled by repeating for a number of cycles a sequence including pulsing a hafnium-containing precursor into a reaction chamber, pulsing an oxygen-containing precursor into the reaction chamber, pulsing a silicon-containing precursor into the reaction chamber, and pulsing a nitrogen-containing precursor until a desired thickness is formed.

The hafnium-containing precursor includes a $HfCl_4$ precursor in some embodiments, and a $HfI_4$ precursor in other embodiments. According to some embodiments, the oxygen-containing precursor includes water vapor or a vapor solution of $H_2O$—$H_2O_2$ into the reaction chamber. According to some embodiments, the silicon-containing precursor includes a $SiCl_4$ precursor. A nitrogen-containing precursor includes a $NH_3$ precursor in some embodiments. $NH_3$ annealing at about 550° C. can also be performed.

Additional information regarding HfSiON dielectric films can be found in US Patent Application Publication 2004/0043569A1, entitled "Atomic Layer Deposited HfSiON Dielectric Films," which is herein incorporated by reference.

Zr—Sn—Ti—O

A Zr—Sn—Ti—O dielectric layer can be formed by depositing titanium and oxygen onto a substrate surface by atomic layer deposition, depositing zirconium and oxygen onto a substrate surface by atomic layer deposition, and depositing tin and oxygen onto a substrate surface by atomic layer deposition. Metal chloride precursors can be pulsed for each metal in the Zr—Sn—Ti—O. In some embodiments, the dielectric film is formed by forming $TiO_2$ onto a surface by atomic layer deposition, depositing zirconium and oxygen onto the surface by atomic layer deposition, and depositing tin and oxygen onto the surface by atomic layer deposition. The $TiO_2$ deposition can include pulsing a $TiCl_4$ precursor. The zirconium and oxygen deposition can include pulsing a $ZrCl_4$ precursor. The tin and oxygen deposition can include pulsing a $SnCl_4$ precursor. In various embodiments, the formation of the dielectric film is controlled such that the dielectric film has a composition substantially of $Zr_ySn_xTi_{1-x-y}O_4$ with $0.3<y<0.7$ and $0<x<0.2$.

In some embodiments, the dielectric film is formed by forming $TiO_2$ onto a surface by atomic layer deposition using a $TiI_4$ precursor; depositing zirconium and oxygen by atomic layer deposition using a zirconium halide precursor following forming $TiO_2$; and depositing tin and oxygen by atomic layer deposition using a tin halide precursor following depositing zirconium and oxygen. The zirconium and oxygen deposition can include pulsing a $ZrI_4$ precursor. The tin and oxygen deposition can include pulsing a $SnI_4$ precursor. In various embodiments, the formation of the dielectric film is controlled such that the dielectric film has a composition substantially of $Zr_ySn_xTi_{1-x-y}O_4$ with $0.3<y<0.7$ and $0<x<0.2$. In various embodiments, the formation of the dielectric film is controlled such that the dielectric film has a composition substantially of $Zr_{0.2}Sn_{0.2}Ti_{0.6}O_2$.

Additional information regarding Zr—Sn—Ti—O dielectric films can be found in US Patent Application Publication 2004/0110391 A1, entitled "Atomic Layer Deposited Zr—Sn—Ti—O Films," and US Patent Application Publication 2004/0110348A1, entitled "Atomic Layer Deposited Zr—Sn—Ti—O Films using $TiI_4$," which are herein incorporated by reference.

Metal Oxynitride

The high-k dielectric film can be formed as a metal oxynitride, formed by atomic layer deposition of a plurality of reacted monolayers. The monolayers comprise at least one each of a metal, an oxide and a nitride. According to various embodiments, the metal oxynitride layer is formed from zirconium oxynitride, hafnium oxynitride, tantalum oxynitride, or mixtures thereof.

According to various process embodiments, a plurality of gaseous precursors can be separately introduced to a surface of the semiconductor substrate. The gaseous precursors comprise a metal gaseous precursor and at least two non-metallic gaseous precursors. A first gaseous precursor of the plurality of gaseous precursors is purged or evacuated from the surface of the semiconductor substrate before a second gaseous precursor of the plurality of gaseous precursors is introduced to the surface of the semiconductor substrate. The metal gaseous precursor can include zirconium tetrachloride, zirconium tetraiodide, hafnium tetrachloride, hafnium tetraiodide, or a halogenated tantalum. An oxygen-containing gaseous precursor and a nitrogen-containing gaseous precursor are separately introduced to the surface of the semiconductor substrate. For example, water or hydrogen peroxide can be used as the oxygen-containing gaseous precursor and at least one of ammonia, tert-butylamine, allylamine, and 1,1-dimethylhydrazine can be used as the nitrogen-containing gaseous precursor. Thus, monolayers of metal, oxide, and nitride are formed, and the metal, oxide, and nitride monolayers are reacted to form the metal oxynitride layer.

Additional information regarding metal oxynitride dielectric layers can be found in US Patent Application Publication 2004/0144980A1, entitled "Atomic Layer Deposition of Metal Oxynitride Layers as Gate Dielectrics and Semiconductor Device Structures Utilizing Metal Oxynitride Layers," which is herein incorporated by reference.

$HfO_2/Hf$

The high-k dielectric film can be $HfO_2/Hf$, which can be formed by depositing a hafnium metal layer on a substrate surface by atomic layer deposition and depositing a hafnium oxide layer on the hafnium metal layer by atomic layer deposition to form a hafnium oxide dielectric layer substantially free of silicon oxide. In general, a layer of a metal is formed on a substrate by atomic layer deposition, and an oxide of the metal is formed on the metal by atomic layer deposition.

A hafnium nitrate precursor, such as an anhydrous hafnium nitrate precursor, can be used to form the layer of hafnium. A layer of hafnium oxide can be formed using an anhydrous hafnium nitrate precursor and a water vapor precursor. The substrate may be maintained at about 180° C. during the formation of the layer of hafnium and the formation of the layer of hafnium oxide.

Additional information regarding metal oxide/metal dielectric films, such as $HfO_2/Hf$, can be found in US Patent Application Publication 2004/0175882A1, entitled "Atomic Layer Deposited Dielectric Layers," which is herein incorporated by reference.

$ZrAl_xO_y$

The high-k dielectric film can be $ZrAl_xO_y$, which can be formed by ALD by pulsing a zirconium-containing precursor onto a substrate, pulsing a first oxygen-containing precursor, pulsing an aluminum-containing precursor, and pulsing a second oxygen-containing precursor to form $ZrAl_xO_y$. A precursor can be used that includes both zirconium and oxygen to provide the zirconium and oxygen in one pulsing process, and a precursor can be used that contains both aluminum and oxygen to provide the aluminum and oxygen in one pulse. In various embodiments, the dielectric layer contains $Zr_4AlO_9$. An interfacial layer of silicon oxide or silicon between the substrate and the $ZrAl_xO_y$ dielectric can be less than about 1 nm. The zirconium-containing precursor can be selected from $ZrCl_4$ and $ZrI_4$ precursors. The aluminum-containing precursor can be selected from trimethylaluminum and DMEAA. Oxygen-containing precursors can be selected from $H_2O$, $H_2O_2$, and a $H_2O$—$H_2O_2$ mixture.

Additional information regarding $ZrAl_xO_y$ dielectric layers can be found in US Patent Application Publication 2005/0054165A1, entitled "Atomic Layer Deposited $ZrAl_xO_y$ Dielectric Layers," which is herein incorporated by reference.

$ZrTiO_4$

The high-k dielectric film can be $ZrTiO_4$, which can be formed by ALD by pulsing a titanium-containing precursor onto a substrate, and pulsing a zirconium-containing precursor to form an oxide containing Zr and Ti. The pulsing of the titanium-containing precursor and the pulsing of the zirconium-containing precursor is controlled to provide a dielectric layer with a predetermined zirconium to titanium ratio. In various embodiments, the $ZrTiO_4$ film is formed with a Zr/Ti ratio of about 0.4/0.6. A zirconium-containing precursor used to form the oxide containing Zr and Ti can include zirconium tertiary-butoxide. The titanium-containing precursor can be selected from $TiCl_4$, $TiI_4$, $Ti(OCH_3)_2)_4$, and $Ti(OC_2H_5)_4$. The first pulsing of the titanium-containing precursor can be performed before pulsing the zirconium tertiary-butoxide precursor.

Reactant precursors that can be used after pulsing the titanium-containing precursor and pulsing the zirconium tertiary-butoxide precursor can be selected from $H_2O$, $H_2O_2$, ROH, $N_2O$, $O_3$, and $O_2$. The substrate can be kept at a temperature ranging from about 200° C. to about 400° C. A silicon nitride layer can be formed between the substrate and the film containing $ZrTiO_4$. The ALD-formed film can be a nanolaminate of $ZrO_2$ and $TiO_2$.

Additional information regarding $ZrTiO_4$ dielectric layers can be found in US Patent Application Publication 2004/0214399A1, entitled "Atomic Layer Deposited $ZrTiO_4$ Films," which is herein incorporated by reference.

Zr-Doped Ta Oxide

The high-k dielectric film can be a zirconium-doped tantalum oxide dielectric layer, such as can be formed by depositing tantalum by atomic layer deposition onto a substrate surface and depositing a zirconium dopant by atomic layer deposition onto the substrate surface. The formation of the zirconium-doped tantalum oxide can include pulsing a tantalum-containing precursor to deposit tantalum onto a substrate surface, pulsing an oxygen-containing precursor to deposit oxygen onto the substrate surface, repeating for a number of cycles the pulsing of the tantalum-containing precursor and the pulsing of the oxygen-containing precursor, and substituting a zirconium cycle for one or more cycles of the pulsing of the tantalum-containing precursor. The zirconium cycle includes pulsing a zirconium-containing precursor to deposit zirconium onto the substrate surface. A reactant precursor is selected to produce an oxidizing reaction for the zirconium at the substrate surface. According to various embodiments, a tantalum-containing precursor includes $Ta(OC_2H_5)_5$, and a zirconium-containing precursor includes $ZrI_4$.

Additional information regarding zirconium-doped tantalum oxide dielectric layers can be found in U.S. patent application Ser. No. 10/909,959, filed Aug. 2, 2004, entitled "Atomic Layer Deposition of Zirconium-Doped Tantalum Oxide Films," which is herein incorporated by reference.

$HfO_2$—$Si_3N_4$ on $SiO_2$

The high-k dielectric layer can be formed by depositing $HfO_2$-Silicon-Nitride by atomic layer deposition. The $HfO_2$-Silicon-Nitirde is formed on $SiO_2$. The silicon nitride can be formed using $SiCl_4$ and $NH_3$ gases, and $HfO_2$ can be formed by ALD using hafnium tetraiodide and oxygen as precursors. Anhydrous $Hf(NO_3)_4$ and $H_2O$ vapor may also be used.

Ru Gate and La-Oxide

Various embodiments use a lanthanide oxide high-k dielectric with a ruthenium or ruthenium oxide gate. In various embodiments, the lanthanide oxide dielectric layer is formed by depositing lanthanum by atomic layer deposition onto a substrate surface using a trisethylcyclopentadionatolanthanum precursor or a trisdipyvaloylmethanatolanthanum precursor. A ruthenium gate on a lanthanide oxide dielectric layer provides a gate structure that effectively prevents a reaction between the gate and the lanthanide oxide dielectric layer.

Additional information regarding ruthenium on lanthanide oxide can be found in U.S. patent application Ser.

No. 10/926,812, filed Aug. 26, 2004, entitled "Ruthenium Gate For a Lanthanide Oxide Dielectric Layer," which is herein incorporated by reference.

$TiAlO_X$

The high-k dielectric film can be provided by a titanium aluminum oxide film, which can be formed by depositing titanium and/or aluminum by atomic layer deposition onto a substrate surface. The deposited titanium and/or aluminum is annealed using atomic oxygen. After annealing, a layer of titanium aluminum oxide is formed on the annealed layer to form a contiguous layer of titanium aluminum oxide.

Forming the dielectric includes forming an insulating metal oxide, which includes forming a first layer of at least one of a first metal and a second metal by atomic layer deposition, annealing the first layer using oxygen, and forming, after annealing the first layer, a second layer of an insulating metal oxide of the first metal and the second metal onto the first layer by atomic layer deposition to form a contiguous layer. The first layer can include a layer of the first metal and the second metal. The first layer can have a thickness of about one monolayer or at most substantially two monolayers.

According to various embodiments, a first layer of titanium aluminum oxide is formed by atomic layer deposition, and the first layer is annealed using atomic oxygen. A second layer of titanium aluminum oxide is formed onto the first layer by atomic layer deposition, after annealing the first layer, to form a contiguous layer. The first layer of titanium aluminum oxide can be formed using $TiI_4$ or trimethylaluminum as a precursor, and the second layer of titanium aluminum oxide can be formed using $TiCl_4$ as a precursor. The titanium oxide and the titanium aluminum oxide film can be formed as a nanolaminate.

Additional information regarding titanium aluminum oxide films can be found in U.S. patent application Ser. No. 10/931,533, filed Aug. 31, 2004, entitled "Atomic Layer Deposited Titanium Aluminum Oxide Films," which is herein incorporated by reference.

$LaAlO_X$

The high-k dielectric film can be provided by a lanthanum aluminum oxide dielectric layer, which can be formed by depositing aluminum and lanthanum by atomic layer deposition onto a substrate surface in which precursors to deposit the lanthanum include a trisethylcyclopentadionatolanthanum precursor and/or a trisdipyvaloylmethanatolanthanum precursor, and a metal (e.g. Al) containing precursor is also used. The lanthanum aluminum oxide can be formed as a compound of lanthanum oxide and aluminum oxide. The dielectric layer can include $LaAlO_3$.

Additional information regarding titanium aluminum oxide films can be found in U.S. patent application Ser. No. 10/930,167, filed Aug. 31, 2004, entitled "Atomic Layer Deposited Lanthanum Aluminum Oxide Dielectric Layer," which is herein incorporated by reference.

$La_2Hf_2O_7$

The high-k dielectric can be provided as a lanthanum hafnium oxide layer, which can be formed by depositing hafnium and lanthanum by atomic layer deposition onto a substrate surface. The process includes introducing a lanthanum-containing precursor to a substrate, and introducing a hafnium-containing precursor to the substrate. Embodiments include methods and apparatus in which precursors to deposit the lanthanum include a trisethylcyclopentadionatolanthanum ($La(EtCp)_3$) precursor, a tris(2,2,6,6-tetramethyl-3,5-heptanedionato)lanthanum (III) precursor, a trisdipyvaloylmethanatolanthanum precursor, or a tris(2,2,6,6-tetramethyl-3,5-heptanedionato)lanthanum (III) tetraglyme adduct precursor.

Additional information regarding titanium aluminum oxide films can be found in U.S. patent application Ser. No. 11/010,529, filed Dec. 13, 2004, entitled "Atomic Layer Deposited Lanthanum Hafnium Oxide Dielectrics," which is herein incorporated by reference.

HfTaO

The high-k dielectric can be provided as a hafnium tantalum oxide film, which can be formed by depositing hafnium and tantalum by atomic layer deposition onto a substrate surface. A tantalum-containing precursor can include a tantalum ethoxide precursor, and a hafnium-containing precursor can include a hafnium nitrate precursor.

Additional information regarding titanium aluminum oxide films can be found in U.S. patent application Ser. No. 11/029,757, filed Jan. 5, 2005, entitled "Atomic Layer Deposited Hafnium Tantalum Oxide Dielectrics," which is herein incorporated by reference.

Hafnium Titanium Oxide

The high-k dielectric can be provided as hafnium titanium oxide, such as $HfTiO_4$, formed by ALD using precursors substantially free of chlorine and carbon. Precursors capable of being used include a titanium halide precursor such as a titanium iodine precursor, a titanium nitride precursor, a titanium isopropoxide precursor, and a hafnium halide precursor such as a hafnium chloride precursor.

Amorphous Lanthanide Doped $TiO_X$

The high-k dielectric can be provided as an ALD-formed amorphous dielectric layer of titanium oxide ($TiO_X$) doped with lanthanide elements, such as samarium, europium, gadolinium, holmium, erbium and thulium. The dielectric structure is formed by depositing titanium oxide by atomic layer deposition onto a substrate surface using precursor chemicals, followed by depositing a layer of a lanthanide dopant, and repeating to form a sequentially deposited interleaved structure. The leakage current of the dielectric layer is reduced when the percentage of the lanthanide element doping is optimized. The amorphous dielectric layer is formed on a substrate by atomic layer deposition at a predetermined temperature, such as within a range of approximately 100° C. to 250° C. The amorphous dielectric layer can be comprised of a plurality of individual titanium oxide layers, with at least one lanthanide layer interleaved between each individual one of the titanium oxide layers. The dielectric layer can have a titanium to lanthanide ratio selected to obtain a dielectric constant value of from 50 to 100, and can be selected with a titanium to lanthanide ratio selected to obtain a leakage current of less than $10^{-8}$ A/cm$^2$ and a breakdown voltage of greater than 2.0 MV/cm.

Additional information regarding titanium aluminum oxide films can be found in U.S. patent application Ser. No. 11/092,072, filed Mar. 29, 2005, entitled "ALD of Amorphous Lanthanide Doped $TiO_X$ Films," which is herein incorporated by reference.

Ti Gate Dielectric

The high-k dielectric can be provided as a Ti gate dielectric, which may be formed by providing a substrate assembly in a vacuum chamber, and forming a gate dielectric on the surface, including forming a metal oxide on at least a portion of the surface of the substrate assembly by electron beam evaporation, and generating an ion beam using an inert gas to provide inert gas ions for contacting the metal oxide during formation thereof. An environment including oxygen (e.g. ozone) can be provided in the vacuum chamber to form the metal oxide in the oxygen environment. The metal oxide can be selected from the group consisting of $TiO_2$, $Y_2O_3$, $Al_2O_3$, $ZrO_2$, $HfO_2$, $Y_2O_3$—$ZrO_2$, $ZrSiO_4$, $LaAlO_3$, and $MgAl_2O_4$.

Additional information regarding titanium aluminum oxide films can be found in U.S. Pat. No. 6,495,436, entitled "Formation Of Metal Oxide Gate Dielectric," which is herein incorporated by reference.

$TiO_2$

The high-k dielectric can be provided as a $TiO_2$ dielectric, which can be physically vapor formed as a high purity metal layer over the semiconductor substrate. After forming such a layer, the high purity metal layer can be oxidized employing atomic oxygen generated in a high density plasma environment to form the dielectric material. The physically vapor formed high purity metal layer can have at least about 99.9% purity over the semiconductor substrate. The physical vapor formation can include electron beam evaporation. Prior to the electron beam evaporation, the vacuum chamber can be evacuated to a base pressure of about $1\times10^{-7}$ Torr or lower, and a low-energy ion-bombardment source is directed towards the semiconductor substrate during the electron beam evaporation. A low-energy argon ion-bombardment can be directed towards the semiconductor substrate during the electron beam evaporation. The high purity metal layer can include two or more high purity metals, such as a metal-silicon alloy. The high purity metal can be selected from titanium, yttrium, zirconium, hafnium and various mixtures thereof.

Additional information regarding $TiO_2$ films can be found in U.S. Pat. No. 6,534,420, entitled "Methods For Forming Dielectric Materials and Methods for Forming Semiconductor Devices," which is herein incorporated by reference.

Amorphous $HfO_2$

The high-k dielectric can include hafnium oxide, which can be formed by forming a thin hafnium (Hf) film by thermal evaporation at a low substrate temperature, and radically oxidizing the thin hafnium film using a krypton/oxygen ($Kr/O_2$) high-density plasma to form the gate dielectric layer of hafnium oxide ($HfO_2$). The resulting gate dielectric layer is thermally stable in contact with silicon and is resistive to impurity diffusion at the $HfO_2$/silicon interface. The formation of the $HfO_2$ eliminates the need for a diffusion barrier layer, allows thickness uniformity of the field oxide on the isolation regions, and preserves the atomically smooth surface of the silicon substrate. The hafnium layer can be formed by electron beam evaporation.

Additional information regarding $HfO_2$ and other amorphous high-k gate oxide films can be found in U.S. Pat. No. 6,514,828, entitled "Method of Fabricating a Highly Reliable Gate Oxide," which is herein incorporated by reference.

$CoTiO_3$

The high-k dielectric can be provided by $CoTiO_3$, which can be formed from alloys such as cobalt-titanium. These alloys are thermodynamically stable such that the gate dielectrics formed will have minimal reactions with a silicon substrate or other structures during any later high temperature processing stages. The underlying substrate surface smoothness is preserved by using a thermal evaporation technique to deposit the layer to be oxidized. A metal alloy layer is evaporation deposited on the body region, and the metal alloy layer is oxidized to form a metal oxide layer on the body region. Cobalt and titanium can be evaporation deposited, such as by electron beam evaporation. The evaporation deposition of the metal alloy layer can be performed at a substrate temperature range of 100–150° C., and the oxidation of the metal alloy layer can be performed at a temperature of approximately 400° C. A krypton (Kr)/oxygen ($O_2$) mixed plasma can be used in the oxidization process.

Additional information regarding $CoTiO_3$ can be found in US Patent Publication No. 2003/0119246A1, entitled "Low-Temperature Grown High Quality Ultra-Thin $CoTiO_3$ Gate Dielectrics," which is herein incorporated by reference.

Oxides of Group IVB Elements (e.g. $ZrO_2$)

The high-k gate dielectric can be formed from elements like zirconium, such as $ZrO_2$, which are thermodynamically stable such that the gate dielectric will have little reaction with a silicon substrate or other structures during any later high temperature processing stages. The gate dielectric can be formed by evaporation depositing a metal layer on the body region, the metal being chosen from the group IVB elements of the periodic table, and oxidizing the metal layer to form a metal oxide layer on the body region. The metal layer can include a zirconium layer, which can be deposited by electron beam evaporation. The substrate temperature range for the deposition can be within a range of 150–400° C. The oxidation can be performed using atomic oxygen or with a krypton (Kr)/oxygen ($O_2$) mixed plasma, for example.

Additional information regarding $ZrO_2$ and other amorphous high-k gate oxide films can be found in US Patent Publication No. 2003/0045078A1, entitled "Highly Reliable Amorphous High-K Gate Oxide $ZrO_2$," which is herein incorporated by reference.

Group IIIB/Rare Earth Series (Crystalline or Amorphous $Y_2O_3$ and $Gd_2O_3$)

The high-k dielectric can be provided using elements such as yttrium and gadolinium, which are thermodynamically stable such that the resulting gate dielectrics have minimal reaction with a silicon substrate or other structures during any later high temperature processing stages. The underlying substrate surface smoothness is preserved using a thermal evaporation technique to deposit the layer to be oxidized. The gate dielectric can be formed by evaporation depositing a metal layer on the body region, where the metal is chosen from a group consisting of the group IIIB elements and the rare earth series of the periodic table, and by oxidizing the metal layer to form a metal oxide layer on the body region. The metal layer can be yttrium and can be gadolinium. Electron beam evaporation can be used. The substrate temperature for the deposition can be approximately 150–400° C. Atomic oxygen and a krypton (Kr)/oxygen ($O_2$) mixed plasma can be used to oxidize the metal layer, for example.

Additional information regarding gate oxides formed from elements such as yttrium and gadolinium can be found in U.S. Pat. No. 6,844,203 entitled "Gate Oxides, and Methods of Forming," which is herein incorporated by reference.

Praseodymium Oxide

The gate dielectric can be provided by a praseodymium oxide. The Pr gate oxide is thermodynamically stable so that the oxide reacts minimally with a silicon substrate or other structures during any later high temperature processing stages. The underlying substrate surface smoothness is preserved using a thermal evaporation technique to deposit a Pr layer to be oxidized. The gate dielectric can be formed by evaporation depositing a praseodymium (Pr) layer on the body region, and oxidizing the Pr layer to form a $Pr_2O_3$ layer on the body region. Electron beam evaporation can be used. The substrate temperature for the deposition can be in an approximate range of 150–400° C. Atomic oxygen and a krypton (Kr)/oxygen ($O_2$) mixed plasma can be used to oxidize the Pr layer, for example. The $Pr_2O_3$ layer can be formed to have an equivalent oxide thickness of less than 2 nm.

Additional information regarding praseodymium gate oxides can be found in U.S. Pat. No. 6,900,122, entitled "Low-Temperature Grown High-Quality Ultra-Thin Praseodymium Gate Dielectrics," which is herein incorporated by reference.

$ZrO_XN_Y$

The high-k dielectric can be provided by a metal oxynitride such as $ZrO_XN_Y$. The addition of nitrogen to the microstructure of the gate dielectric promotes an amorphous phase that provides the gate dielectric with improved electrical properties. The underlying substrate surface smoothness is preserved by using a thermal evaporation technique to first deposit a metal layer. The gate dielectric can be formed by evaporation depositing a metal layer such as a zirconium layer on the body region, oxidizing the metal layer, and nitriding the metal layer. Electron beam evaporation can be used. The substrate temperature for the deposition can be in an approximate temperature range of 150–400° C., Atomic oxygen and a krypton (Kr)/oxygen ($O_2$) mixed plasma, for example, can be used to oxidize the metal layer. The metal layer can be annealed in $NH_3$ at a temperature of approximately 700° C.

Additional information regarding $ZrO_XN_Y$ gate oxides can be found in U.S. Pat. No. 6,767,795 entitled "Highly Reliable Amorphous High-K Gate Dielectric $ZrO_XN_Y$," which is herein incorporated by reference.

$LaAlO_3$

The high-k dielectric can be provided by $LaAlO_3$. A $LaAlO_3$ gate dielectric can be formed by evaporating $Al_2O_3$ at a given rate, evaporating $La_2O_3$ at another rate, and controlling the two rates to provide an amorphous film containing $LaAlO_3$ on a transistor body region. The evaporation deposition of the $LaAlO_3$ film is performed using two electron guns to evaporate dry pellets of $Al_2O_3$ and $La_2O_3$. The two rates for evaporating the materials are selectively chosen to provide a dielectric film composition having a predetermined dielectric constant ranging from the dielectric constant of an $Al_2O_3$ film to the dielectric constant of a $La_2O_3$ film. Electron beam evaporation can be used. A predetermined dielectric constant can be achieved by controlling the evaporation rates.

Additional information regarding evaporated $LaAlO_3$ gate dielectrics can be found in U.S. Pat. No. 6,893,984, entitled "Evaporated $LaAlO_3$ Films for Gate Dielectrics," which is herein incorporated by reference.

$TiO_X$

The high-k dielectric can be provided by $TiO_X$. The dielectric film can be formed by ion assisted electron beam evaporation of $TiO_2$ and electron beam evaporation of a lanthanide selected from a group consisting of Nd, Tb, and Dy. The growth rate is controlled to provide a dielectric film having a lanthanide content ranging from about ten to about thirty percent of the dielectric film. These dielectric films containing lanthanide doped $TiO_X$ are amorphous and thermodynamically stable such that the lanthanide doped $TiO_X$ will have minimal reaction with a silicon substrate or other structures during processing.

The film can be formed by evaporating $TiO_2$ at a first rate, evaporating a lanthanide at a second rate, and controlling the first rate and the second rate to grow a dielectric film on a substrate, the dielectric film containing $TiO_X$ doped with the lanthanide. The lanthanide can be selected from a group consisting of Nd, Tb, Dy. Electron beam evaporation can be used. The rates can be controlled to selectively grow the dielectric film doped in the range from about 10% to about 30% lanthanide. The rates can be controlled so that the dielectric film has a dielectric constant ranging from about 50 to about 110.

Additional information regarding evaporated lanthanide doped $TiO_X$ dielectric films can be found in U.S. Pat. No. 6,790,791 entitled "Lanthanide Doped $TiO_X$ Dielectric Films," which is herein incorporated by reference.

$TiO_X$ by Kr Plasma Oxidation

The high-k dielectric can be provided by $TiO_X$, which can be formed by ion assisted electron beam evaporation of Ti, electron beam evaporation of a lanthanide selected from a group consisting of Nd, Tb, and Dy, and oxidation of the evaporated Ti/lanthanide film in a Kr/oxygen plasma. The growth rate is controlled to provide a dielectric film having a lanthanide content ranging from about five to about forty percent of the dielectric film. These dielectric films containing lanthanide doped $TiO_X$ are amorphous and thermodynamically stable such that the lanthanide doped $TiO_X$ will have minimal reaction with a silicon substrate or other structures during processing. Electron beam evaporation can be used. The rates can be controlled to provide a lanthanide doped Ti film on the substrate for growing a dielectric film doped in the range from about 5% to about 40% lanthanide. The rates can be controlled to provide the film with a dielectric constant ranging from about 50 to about 110.

Additional information regarding evaporated lanthanide doped $TiO_X$ dielectric films can be found in U.S. Pat. No. 6,884,739 entitled "Lanthanide Doped $TiO_X$ Dielectric Films By Plasma Oxidation," which is herein incorporated by reference.

Y—Si—O

The dielectric can be provided by Y—Si—O dielectrics formed by evaporation deposition techniques.

Oxidation of Metals

The high-k dielectric can be provided by oxidizing metal. Examples of metal oxides include PbO, $Al_2O_3$, $Ta_2O_5$, $TiO_2$, $ZrO_2$, and $Nb_2O_5$.

Additional information regarding oxidation of metals for high-k dielectrics can be found in US Patent Application Publication 2003/0043637 entitled "Flash Memory With Low Tunnel Barrier Interpoly Insulators," which is herein incorporated by reference.

$HfO_2/La_2O_3$

The high-k dielectric can be provided by an $HfO_2/La_2O_3$ nanolaminate structure. The dielectric can be formed by forming a first metal-containing dielectric layer over the surface of the substrate, the metal comprising an element selected from Group IVB of the periodic table, and forming a second metal-containing dielectric layer over the first metal-containing dielectric layer. For example, the first metal-containing dielectric layer can include hafnium, and the second metal-containing dielectric layer comprises lanthanum.

A layer of silicon dioxide can be formed to overlie at least one portion of the surface; and the first metal-containing dielectric layer can be formed by forming a metal layer over the layer of silicon dioxide, and combining metal of the metal layer with oxygen of the silicon dioxide layer to form a metal oxide dielectric material. The second metal-containing dielectric layer can be an element selected from Group IIIB of the periodic table.

According to various embodiments, the dielectric is formed by forming a hafnium-containing layer, forming a lanthanum-containing layer over the hafnium-containing layer, and exposing the hafnium-containing layer and the lanthanum-containing layer to an oxygen-comprising atmosphere and heating the hafnium-containing layer and the lanthanum-containing layer to a temperature effective to form a hafnium-containing dielectric layer and a lanthanum-containing dielectric layer. Physical vapor deposition can be used. The thickness of each of the hafnium-containing dielectric layer and the lanthanum-containing dielectric layer can be less than about 5 nm. The ratio of the hafnium thickness to the lanthanum thickness can be from about 1 to 3 to about 1 to 4.

Additional information regarding nanolaminates such as $HfO_2/La_2O_3$ as high-k dielectrics can be found in US Patent Application Publication 2002/0192974 entitled "Dielectric Layer Forming Method and Devices Formed Therewith," which is herein incorporated by reference.

$La_2O_3/Hf_2O_3$

The high-k dielectric can be provided by an $La_2O_3/Hf_2O_3$ nanolaminate. Alternate layers of hafnium oxide and lanthanum oxide over a substrate can be deposited to form a composite. The dielectric can be provided by forming one hafnium oxide monolayer, forming one lanthanum oxide monolayer, and repeating to form a plurality of single hafnium oxide monolayers interspersed among a plurality of single lanthanum oxide monolayers. Multiple hafnium oxide monolayers can be formed to create a hafnium oxide multilayer, and multiple lanthanum oxide monolayers can be formed to create a lanthanum oxide multilayer. A plurality of hafnium oxide multilayers can be interspersed among a plurality of lanthanum oxide multilayers. The hafnium oxide can comprise thermally stable, crystalline hafnium oxide, and the lanthanum oxide can comprise thermally stable, crystalline lanthanum oxide.

According to various methods, at least one monolayer of a first material is chemisorbed over a substrate, where the first material comprises a first metal. At least some of the chemisorbed first material is treated and an oxide of the first metal is formed. At least one monolayer of a second material (second metal) is chemisorbed on the first metal oxide. An oxide of the second metal is formed. One of the first and second metals comprises hafnium and the other comprises lanthanum. The first material can comprise $HfCl_4$, and the chemisorbed first material can be treated by exposure to $H_2O$ to form $HfO_2$. The first material can comprise $La(thd)_3$, and the chemisorbed first material can be treated by exposure to $H_2O$ to form $La_2O_3$.

Additional information regarding nanolaminates such a $La_2O_3/Hf_2O_3$ as high-k dielectrics can be found in US Patent Application Publication 2004/0038554 entitled "Composite Dielectric Forming Methods and Composite Dielectrics," which is herein incorporated by reference.

$HfO_2/ZrO_2$

The high-k dielectric can be provided by a $HfO_2/ZrO_2$ nanolaminate, which can be formed by atomic layer deposition of $HfO_2$ using a $HfI_4$ precursor followed by the formation of $ZrO_2$ on the $HfO_2$ layer. The $HfO_2$ layer thickness is controlled by repeating for a number of cycles a sequence including pulsing the $HfI_4$ precursor into a reaction chamber, pulsing a purging gas into the reaction chamber, pulsing a first oxygen-containing precursor into the reaction chamber, and pulsing the purging gas until the desired thickness is formed. These gate dielectrics containing $HfO_2/ZrO_2$ nanolaminates are thermodynamically stable such that the $HfO_2/ZrO_2$ nanolaminates will have minimal reaction with a silicon substrate or other structures during processing.

The layer of zirconium oxide can be formed by rapid thermal CVD at about 500° C. A nitrogen anneal between about 700° C. and about 900° C. can be performed after the layer of zirconium oxide is formed. The layer of hafnium oxide can be formed by pulsing a first oxygen-containing precursor, such as water vapor, into the reaction chamber after pulsing the $HfI_4$ precursor into the reaction chamber.

Additional information regarding nanolaminates such a $HfO_2/ZrO_2$ as high-k dielectrics can be found in US Patent Application Publication 2004/0023461 entitled "Atomic Layer Deposited Nanolaminates of $HfO_2/ZrO_2$ films as Gate Dielectrics," which is herein incorporated by reference.

Lanthanide Oxide/Zirconium Oxide

The high-k dielectric can be provided by a lanthanide oxide/zirconium oxide nanolaminate. According to various embodiments, the $ZrO_2$ is deposited by multiple cycles of reaction sequence atomic layer deposition (RS-ALD) that includes depositing a $ZrI_4$ precursor onto the surface of the substrate in a first pulse followed by exposure to $H_2O/H_2O_2$ in a second pulse, thereby forming a thin $ZrO_2$ layer on the surface. After depositing the $ZrO_2$ layer, the lanthanide oxide layer is deposited by electron beam evaporation. The composite laminate zirconium oxide/lanthanide oxide dielectric layer has a relatively high dielectric constant and can be formed in layers of nanometer dimensions.

Various embodiments provide a layer of $ZrO_2$, and a layer of a lanthanide oxide having a thickness of about 2–12 nm on the $ZrO_2$ layer. The $ZrO_2$ layer has a thickness of about 1–6 nm, and the composite laminate dielectric layer has a thickness of about 3–18 nm. The lanthanide oxide can include $Pr_2O_3$, $Nd_2O_3$, $Sm_2O_3$, $Gd_2O_3$, $Dy_2O_3$ and $PrTi_xO_y$. According to various embodiments, the composite laminate dielectric layer has a dielectric constant between about 12 and about 23. The $ZrO_2$ layer can be formed by atomic layer deposition from a $ZrI_4$ precursor followed by oxidation with $H_2O/H_2O_2$, and the lanthanide oxide layer can be formed by electron beam evaporation of a lanthanide oxide.

Additional information regarding nanolaminates such a lanthanide oxide/zirconium oxide as high-k dielectrics can be found in US Patent Application Publication 2005/0077519 entitled "Lanthanide Oxide/Zirconium Oxide Atomic Layer Deposited Nanolaminate Gate Dielectrics," which is herein incorporated by reference.

Lanthanide Oxide/Hafnium Oxide

The high-k dielectric can be provided by a lanthanide oxide/hafnium oxide nanolaminate, such as can be formed by forming a layer of hafnium oxide by atomic layer deposition and forming a layer of a lanthanide oxide by electron beam evaporation. According to various embodiments, the combined thickness of lanthanide oxide layers is limited to between about 2 nm and about 10 nm. Multilayers of hafnium oxide can be formed, where each layer of lanthanide oxide is limited to a thickness between about 2 nm and 10 nm. Some embodiments limit the combined thickness of hafnium oxide layers to a thickness between about 2 nm and about 10 nm. The lanthanide oxide can include $Pr_2O_3$, $Nd_2O_3$, $Sm_2O_3$, $Gd_2O_3$, and $Dy_2O_3$. The substrate temperature for the deposition can range between about 100° C. to about 150° C. The hafnium oxide can be formed using a $HfI_4$ precursor, and the lanthanide oxide can be formed on the layer of hafnium oxide by electron beam evaporation.

Additional information regarding nanolaminates such a lanthanide oxide/hafnium oxide as high-k dielectrics can be found in US Patent Application Publication 2005/0020017 entitled "Lanthanide Oxide/Hafnium Oxide Dielectric Layers," which is herein incorporated by reference.

Lanthanide Oxide/Hafnium Oxide

The high-k dielectric can be provided by a lanthanide oxide/hafnium oxide nanolaminate. The hafnium oxide can be formed by chemical vapor deposition and the lanthanide oxide can be formed by electron beam evaporation. Forming the layer of hafnium oxide by chemical vapor deposition using precursors that do not contain carbon permits the formation of the dielectric layer without carbon contamination. Various embodiments limit a combined thickness of lanthanide oxide layers to a thickness ranging from about 2 nm to about 10 nm. Various embodiments provide a multilayer of lanthanide oxide, with each layer of lanthanide oxide having a thickness ranging from about 2 nm to about 10 nm. Various embodiments limit a combined thickness of hafnium oxide layers to a thickness ranging from about 2 nanometers to about 10 nanometers. The lanthanide oxide can be selected from $Pr_2O_3$, $Nd_2O_3$, $Sm_2O_3$, $Gd_2O_3$, and $Dy_2O_3$. The substrate can be maintained at a temperature ranging from about 100° C. to about 150° C. during electron beam deposition and the substrate can be maintained at a temperature ranging from about 200° C. to about 400° C. during chemical vapor deposition. The dielectric layer can be formed by forming a layer of hafnium oxide on a substrate by chemical vapor deposition using a $Hf(NO_3)_4$ precursor, and forming a layer of a lanthanide oxide on the layer of hafnium oxide by electron beam evaporation.

Additional information regarding nanolaminates such a lanthanide oxide/hafnium oxide as high-k dielectrics can be found in US Patent Application Publication 2004/0262700 entitled "Lanthanide Oxide/Hafnium Oxide Dielectric Layers," which is herein incorporated by reference.

$PrO_x/ZrO_2$

The high-k dielectric can be provided by a $PrO_x/ZrO_2$ nanolaminate. The nanolaminate layered dielectric structure is formed by depositing praseodymium by atomic layer deposition onto a substrate surface using precursor chemicals, followed by depositing zirconium onto the substrate using precursor chemicals, and repeating to form the thin laminate structure. The dielectric layer can be formed using either a reaction sequence atomic layer deposition, a metallo-organic chemical vapor deposition, or a combination thereof. The praseodymium oxide layer includes forming an amorphous oxide including $Pr_6O_{11}$, $Pr_2O_3$, $PrO_3$, and $PrO_2$, and combinations thereof. The zirconium oxide layer can include an amorphous oxide including $ZrO$, $ZrO_2$, and combinations thereof.

Each individual one of the praseodymium oxide layers can be less than or equal to two monolayers in thickness, or can be a continuous monolayer. The resulting monolayer has a root mean square surface roughness that is less than one tenth of the layer thickness. The thickness of the praseodymium oxide layer and the zirconium oxide layer can be selected to provide the dielectric structure with a dielectric constant greater than 30. The dielectric film can be formed at a temperature of less than 350° C. The dielectric film can be formed using a precursor material comprising a formula $Pr(OCMe_2CH_2Me)_3$.

Additional information regarding nanolaminates such a lanthanide oxide/hafnium oxide as high-k dielectrics can be found in U.S. patent application Ser. No. 11/010,766, filed Dec. 13, 2004 entitled "Hybrid ALD-CVD of $Pr_xO_y/ZrO_2$ Films as Gate Dielectrics," which is herein incorporated by reference.

$Hf_3N_4/HfO_2$

The high-k dielectric can be provided by a hafnium nitride ($Hf_3N_4$)/hafnium oxide ($HfO_2$) nanolaminate. At least one hafnium oxide layer and at least one hafnium nitride layer form the nanolaminate. Both the hafnium oxide and the hafnium nitride can be formed using atomic layer deposition. The dielectric layer can include an amorphous dielectric that includes $HfO_2$, $Hf_3N_4$, and combinations thereof.

The hafnium oxide layer can be comprised of a plurality of individually deposited hafnium oxide layers, where each individual one of the hafnium oxide layers is less than or equal to two monolayers in thickness. Each individual one of the hafnium oxide layers can be a continuous monolayer. Each individual one of the hafnium oxide layers can have a thickness within a range from 1.3 to 1.5 Å. The resulting dielectric layer can have a root mean square surface roughness that is less than one tenth of the layer thickness. A ratio of a thickness of hafnium oxide to a thickness of hafnium nitride can be selected to result in a dielectric constant of the dielectric film of greater than 20. Some embodiments separate the dielectric film from the substrate by a diffusion barrier. The dielectric film can be formed at a temperature less than 300° C.

Hf[(CH$_3$)$_2$]$_4$ can be used as a precursor and water vapor can be used as a reactant to form the hafnium oxide in a deposition process with a temperature between 250° C. to 300° C. HfCl$_4$ can be used as a precursor and water vapor can be used as a reactant to form the hafnium oxide in a deposition process with a temperature of approximately 300° C. Hf[(CH$_3$)$_2$]$_4$ can be used as a precursor and ammonia (NH$_3$) can be used as a reactant to form the hafnium oxide in a deposition process with a temperature of approximately 250° C. Various embodiments provide the hafnium nitride and hafnium oxide film as a continuous layer with a root mean square surface roughness of less than 10 Å and a current leakage rate of less than 5×10$^{-7}$ amps per cm$^2$ at an electric field strength of 1 megavolt per cm.

Additional information regarding nanolaminates such a lanthanide oxide/hafnium oxide as high-k dielectrics can be found in U.S. patent application Ser. No. 11/063,717 filed Feb. 23, 2005 entitled "Atomic Layer Deposition of Hf$_3$N$_4$/HfO$_2$ Films as Gate Dielectrics," which is herein incorporated by reference.

$$Zr_3N_4/ZrO_2$$

The high-k dielectric can be provided by a Zr$_3$N$_4$/ZrO$_2$ nanolaminate. Atomic layer deposition can be used to form at least one zirconium oxide layer and at least one zirconium nitride layer. The dielectric layer can include an amorphous dielectric that includes ZrO$_2$, Zr$_3$N$_4$, and combinations thereof. The zirconium oxide layer can be comprised of a plurality of individually deposited zirconium oxide layers, where each individual one of the zirconium oxide layers is less than or equal to two monolayers in thickness. Each individual one of the zirconium oxide layers can be a continuous monolayer with a step coverage of greater than 90% over 90 degree angle steps. In various embodiments, each individual one of the zirconium oxide layers has a thickness within a range from 1.3 to 1.5 Å. Some embodiments provide the dielectric layer with a root mean square surface roughness that is less than one tenth of the layer thickness. A ratio of a thickness of zirconium oxide to a thickness of zirconium nitride can be selected to result in a dielectric constant of the dielectric film of greater than 20. A diffusion barrier can separate the dielectric film from the substrate. The dielectric film can be formed at a temperature of between 275° C. to 325° C. ZrI$_4$ can be used as a precursor, and water vapor and hydrogen peroxide can be used as reactants to form zirconium oxide in a deposition process where the temperature is between 325° C. to 500° C. ZrCl$_4$ can be used as a precursor, and water vapor can be used as a reactant to form zirconium oxide in a deposition process where the temperature is approximately 300° C. Zr[(CH$_3$)$_2$]$_4$, can be used as a precursor and ammonia (NH$_3$) can be used as a reactant to form zirconium oxide in a deposition process where the temperature is approximately 250° C. The zirconium nitride and zirconium oxide film can each be a continuous layer having a root mean square surface roughness of less than 5 Å and a current leakage rate of less than 1.1×10$^{-7}$ amps per cm$^2$ at an electric field strength of 1 megavolt per cm.

Additional information regarding nanolaminates such a Zr$_3$N$_4$/ZrO$_2$ oxide as high-k dielectrics can be found in U.S. patent application Ser. No. 11/058,563, filed Feb. 15, 2005 entitled "Atomic Layer Deposition of Zr$_3$N$_4$/ZrO$_2$ Films as Gate Dielectrics," which is herein incorporated by reference.

$$TiO_2/CeO_2$$

The high-k dielectric can be provided by a TiO$_2$/CeO$_2$ nanolaminate using ALD processes.

Wafer Level

Figure 3:
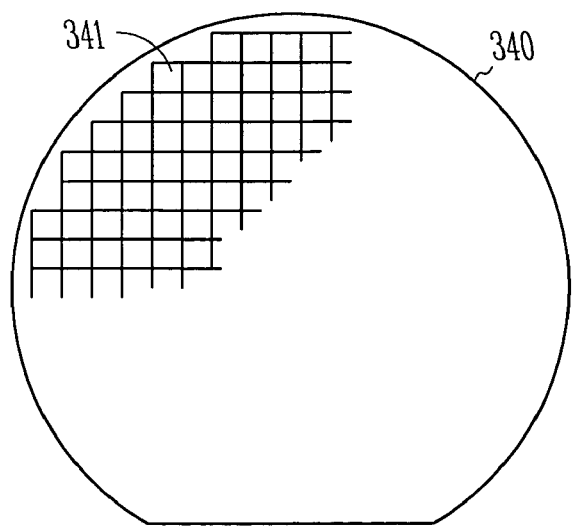
FIG. 3 illustrates a wafer, upon which the transistors with metal substituted gates can be fabricated according to embodiments of the present subject matter.

FIG. 3 illustrates a wafer 340, upon which the transistors with metal substituted gates can be fabricated according to embodiments of the present subject matter. A common wafer size is 8 inches in diameter. However, wafers are capable of being fabricated in other sizes, and the present subject matter is not limited to wafers of a particular size. A number of dies can be formed on a wafer. A die 341 is an individual pattern, typically rectangular, on a substrate that contains circuitry to perform a specific function. A semiconductor wafer typically contains a repeated pattern of such dies containing the same functionality. A die is typically packaged in a protective casing (not shown) with leads extending therefrom (not shown) providing access to the circuitry of the die for communication and control.

System Level

Figure 4:
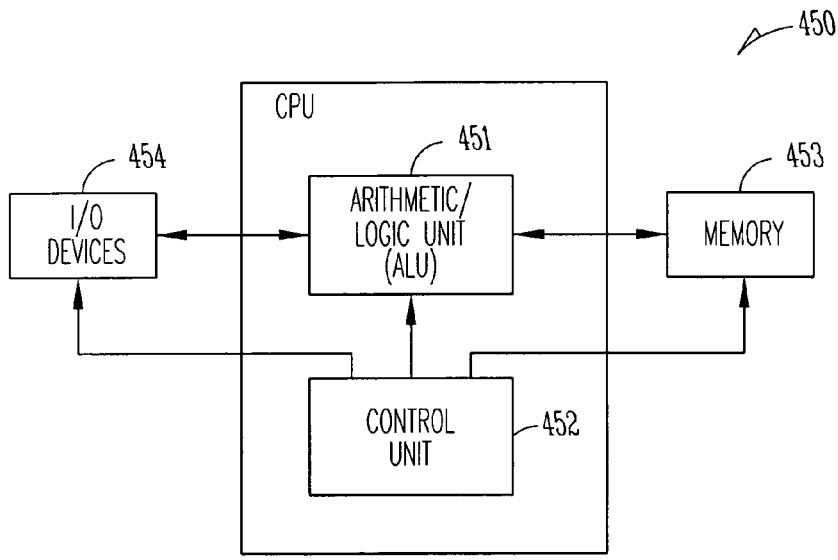
FIG. 4 illustrates a simplified block diagram of a high-level organization of an electronic system that includes the transistor with the metal-substituted gate, according to various embodiments.

FIG. 4 illustrates a simplified block diagram of a high-level organization of an electronic system that includes the transistor with the metal-substituted gate, according to various embodiments. In various embodiments, the system 450 is a computer system, a process control system or other system that employs a processor and associated memory. The electronic system 450 has functional elements, including a processor or arithmetic/logic unit (ALU) 451, a control unit 452, a memory device unit 453 and an input/output (I/O) device 454. Generally such an electronic system 450 will have a native set of instructions that specify operations to be performed on data by the processor 451 and other interactions between the processor 451, the memory device unit 453 and the I/O devices 454. The control unit 452 coordinates all operations of the processor 451, the memory device 453 and the I/O devices 454 by continuously cycling through a set of operations that cause instructions to be fetched from the memory device 453 and executed. According to various embodiments, the memory device 453 includes, but is not limited to, random access memory (RAM) devices, read-only memory (ROM) devices, and peripheral devices such as a floppy disk drive and a compact disk CD-ROM drive. As one of ordinary skill in the art will understand upon reading and comprehending this disclosure, any of the illustrated electrical components are capable of being fabricated to include a transistor with a substituted gate in accordance with the present subject matter.

Figure 5:
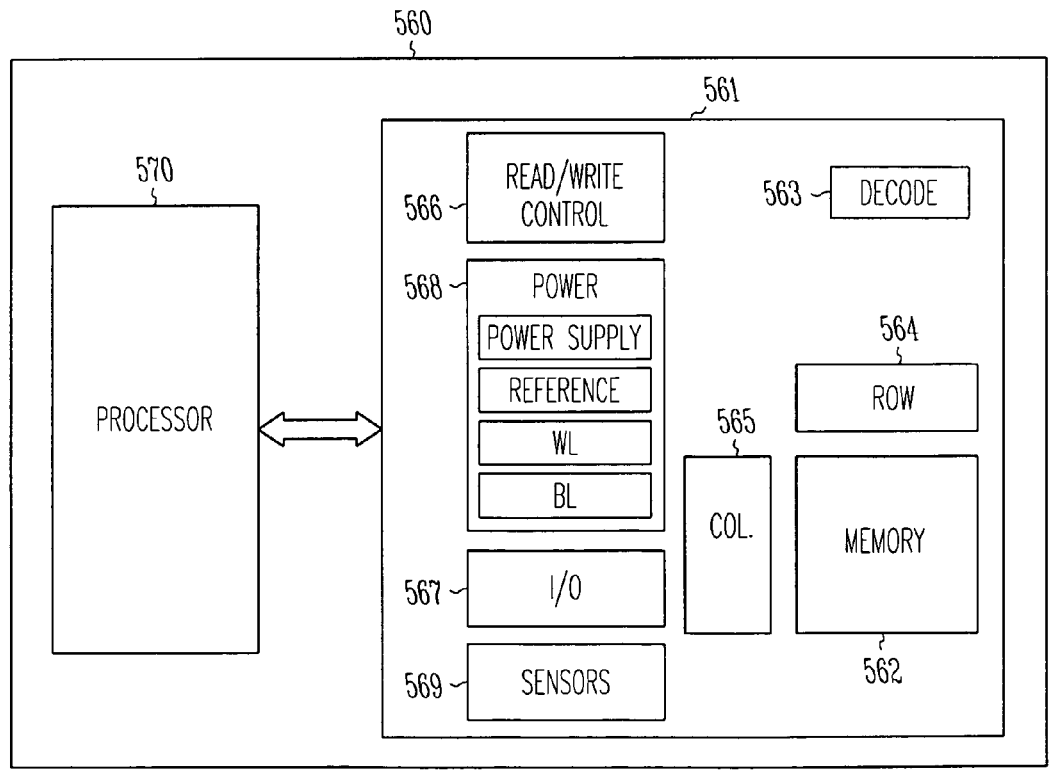
FIG. 5 illustrates a simplified block diagram of a high-level organization of an electronic system that includes transistors with metal substituted gates, according to various embodiments.

FIG. 5 illustrates a simplified block diagram of a high-level organization of an electronic system that includes transistors with metal substituted gates, according to various embodiments. The system 560 includes a memory device 561 which has an array of memory cells 562, address decoder 563, row access circuitry 564, column access circuitry 565, read/write control circuitry 566 for controlling operations, and input/output circuitry 567. The memory device 561 further includes power circuitry 568, and sensors 569 for determining the state of the memory cells. The illustrated power circuitry 568 includes power supply circuitry, circuitry for providing a reference voltage, circuitry for providing the word line with pulses, and circuitry for providing the bit line with pulses. Also, as shown in FIG. 5, the system 560 includes a processor 570, or memory controller for memory accessing. The memory device receives control signals from the processor over wiring or metallization lines. The memory device is used to store data which is accessed via I/O lines. It will be appreciated by those skilled in the art that additional circuitry and control signals can be provided, and that the memory device has been simplified. At least one of the processor or memory device includes the transistor with the metal substituted gate according to the present subject matter.

The illustration of system 560, as shown in FIG. 5, is intended to provide a general understanding of one application for the structure and circuitry of the present subject matter, and is not intended to serve as a complete description of all the elements and features of an electronic system. As one of ordinary skill in the art will understand, such an electronic system can be fabricated in single-package processing units, or even on a single semiconductor chip, in order to reduce the communication time between the processor and the memory device.

Applications containing transistors with metal gates on high-k dielectrics, as described in this disclosure, include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

This disclosure includes several processes, circuit diagrams, and structures. The present invention is not limited to a particular process order or logical arrangement. Although specific embodiments have been illustrated and described herein, it will be appreciated by those of ordinary skill in the art that any arrangement which is calculated to achieve the same purpose may be substituted for the specific embodiments shown. This application is intended to cover adaptations or variations. It is to be understood that the above description is intended to be illustrative, and not restrictive. Combinations of the above embodiments, and other embodiments, will be apparent to those of skill in the art upon reviewing the above description. The scope of the present invention should be determined with reference to the appended claims, along with the full scope of equivalents to which such claims are entitled.

What is claimed is:

1. A method for forming a transistor, comprising:
   forming a gate dielectric on a substrate;
   forming a carbon structure on the gate dielectric;
   forming the source/drain regions for the transistor; and
   substituting a desired gate material for the carbon structure using a metal substitution reaction to provide the desired gate material on the gate dielectric.

2. The method of claim 1, wherein forming a gate dielectric includes forming a high-k gate dielectric.

3. The method of claim 2, wherein forming the high-k gate dielectric includes performing an atomic layer deposition process.

4. The method of claim 2, wherein forming the high-k gate dielectric includes performing an evaporated deposition process.

5. The method of claim 2, wherein forming the high-k gate dielectric includes oxidizing a metal.

6. The method of claim 2, wherein forming the high-k gate dielectric includes forming a nanolaminate.

7. The method of claim 1, wherein substituting the desired gate material for the carbon structure includes substituting gold for the carbon structure.

8. The method of claim 1, wherein substituting the desired gate material for the carbon structure includes substituting silver for the carbon structure.

9. The method of claim 1, wherein substituting the desired gate material for the carbon structure includes substituting a gold alloy for the carbon structure.

10. The method of claim 1, wherein substituting the desired gate material for the carbon structure includes substituting a silver alloy for the carbon structure.

11. The method of claim 1, wherein substituting the desired gate material for the carbon structure includes substituting copper for the carbon structure.

12. The method of claim 1, wherein substituting the desired gate material for the carbon structure includes substituting platinum for the carbon structure.

13. The method of claim 1, wherein substituting the desired gate material for the carbon structure includes substituting rhenium for the carbon structure.

14. The method of claim 1, wherein substituting the desired gate material for the carbon structure includes substituting ruthenium for the carbon structure.

15. The method of claim 1, wherein substituting the desired gate material for the carbon structure includes substituting rhodium for the carbon structure.

16. The method of claim 1, wherein substituting the desired gate material for the carbon structure includes substituting nickel for the carbon structure.

17. The method of claim 1, wherein substituting the desired gate material for the carbon structure includes substituting osmium for the carbon structure.

18. The method of claim 1, wherein substituting the desired gate material for the carbon structure includes substituting palladium for the carbon structure.

19. The method of claim 1, wherein substituting the desired gate material for the carbon structure includes substituting iridium for the carbon structure.

20. The method of claim 1, wherein substituting the desired gate material for the carbon structure includes substituting cobalt for the carbon structure.

21. The method of claim 1, wherein substituting the desired gate material for the carbon structure includes substituting germanium for the carbon structure.

22. A method for forming a transistor, comprising:
    forming a high-k gate dielectric on a substrate;
    forming a carbon structure on the gate dielectric;
    forming the source/drain regions for the transistor; and
    substituting a metal gate material for the carbon structure to provide the metal gate material on the high-k gate dielectric, including:
       forming a layer of the metal gate material on the carbon structure; and
       annealing the structure at a temperature below a eutectic temperature of the metal gate material and the carbon to encourage a substitution reaction to replace the carbon structure with the metal gate material such that a resulting metal gate is provided on the high-k dielectric.

23. The method of claim 22, further comprising removing remnants of the layer of the metal gate material and replaced carbon from the metal gate, forming a contact with the metal gate, and forming contacts with the source/drain regions.

24. The method of claim 22, wherein forming the high-k gate dielectric includes performing an atomic layer deposition process to form the high-k gate dielectric.

25. The method of claim 22, wherein forming the high-k gate dielectric includes performing an evaporation deposition process to form the high-k gate dielectric.

26. The method of claim 22, wherein forming the high-k gate dielectric includes oxidizing a metal.

27. The method of claim 22, wherein forming the high-k gate dielectric includes forming a nanolaminate of two or more high-k dielectrics.

28. The method of claim 22, wherein the metal gate material is selected from a group consisting of: gold, alloys of gold, silver, alloys of silver, platinum, rhenium, ruthenium, rhodium, nickel, osmium, palladium, iridium, cobalt, and germanium.

29. A method for forming a transistor, comprising:
forming a high-k gate dielectric on a substrate, including at least one of performing an atomic layer deposition process to form the high-k dielectric, performing an evaporated deposition process to form the high-k dielectric, and oxidizing a metal to form the high-k dielectric;
forming a substitutable carbon structure on the gate dielectric;
forming the source/drain regions for the transistor; and
substituting a desired gate material for the substitutable carbon structure using a metal substitution reaction to provide the desired gate material on the gate dielectric.

30. The method of claim 29, wherein forming the high-k gate dielectric includes forming a nanolaminate.

31. The method of claim 29, wherein substituting the desired gate material includes:
forming a layer of the desired gate material on the substitutable structure; and
annealing the structure at a temperature below a eutectic temperature of the desired gate material and the substitutable structure to encourage a substitution reaction to replace the substitutable structure with the desired gate material such that a resulting gate is provided on the high-k dielectric.

32. The method of claim 29, wherein the substitutable carbon structure further includes silicon or germanium.

33. The method of claim 29, wherein the desired gate material is selected from a group consisting of aluminum, silver, gold, silver alloys and gold alloys.

34. The method of claim 29, wherein the substitutable structure is formed from carbon and the desired gate material is selected from a group consisting of aluminum, silver, gold, silver alloys, gold alloys, copper, platinum, rhenium, ruthenium, rhodium, nickel, osmium, palladium, iridium, cobalt and germanium.

35. The method of claim 29, wherein forming a high-k gate dielectric includes forming aluminum oxide.

36. The method of claim 29, wherein forming a high-k gate dielectric includes forming titanium oxide.

37. The method of claim 29, wherein forming a high-k gate dielectric includes forming yttrium oxide.

38. The method of claim 29, wherein forming a high-k gate dielectric includes forming zirconium oxide.

39. The method of claim 29, wherein forming a high-k gate dielectric includes forming hafnium oxide.

40. The method of claim 29, wherein forming a high-k gate dielectric includes forming zirconium silicon oxide.

41. The method of claim 29, wherein forming a high-k gate dielectric includes forming lanthanide aluminum oxide.

42. The method of claim 29, wherein forming a high-k gate dielectric includes forming magnesium aluminum oxide.

43. The method of claim 29, wherein forming a high-k gate dielectric includes forming hafnium aluminum oxide.

44. The method of claim 29, wherein forming a high-k gate dielectric includes forming zirconium aluminum oxide.

45. The method of claim 29, wherein forming a high-k gate dielectric includes forming an oxide of cobalt and titanium.

46. The method of claim 29, wherein forming a high-k gate dielectric includes forming gadolinium oxide.

47. The method of claim 29, wherein forming a high-k gate dielectric includes forming zirconium oxynitride.

48. The method of claim 29, wherein forming a high-k gate dielectric includes forming Y—Si—O.

49. The method of claim 29, wherein forming a high-k gate dielectric includes forming praseodymium based lanthanum oxide.

50. The method of claim 29, wherein forming a high-k gate dielectric includes forming lanthanide-doped titanium oxide.

51. The method of claim 29, wherein forming a high-k gate dielectric includes forming hafnium silicon oxynitride.

52. The method of claim 29, wherein forming a high-k gate dielectric includes forming Zr—Sn—Ti—O.

53. The method of claim 29, wherein forming a high-k gate dielectric includes forming metal oxynitride.

54. The method of claim 29, wherein forming a high-k gate dielectric includes forming an oxide including zirconium and titanium.

55. The method of claim 29, wherein forming a high-k gate dielectric includes forming zirconium-doped tantalum oxide.

56. The method of claim 29, wherein forming a high-k gate dielectric includes forming hafnium oxide-silicon nitride.

57. The method of claim 29, wherein forming a high-k gate dielectric includes forming lanthanide oxide, and the desired gate material includes ruthenium.

58. The method of claim 29, wherein forming a high-k gate dielectric includes forming titanium aluminum oxide.

59. The method of claim 29, wherein forming a high-k gate dielectric includes forming hafnium titanium oxide.

60. The method of claim 29, wherein forming a high-k gate dielectric includes forming lanthanide hafnium oxide.

61. The method of claim 29, wherein forming a high-k gate dielectric includes forming hafnium tantalum oxide.

* * * * *

UNITED STATES PATENT AND TRADEMARK OFFICE
CERTIFICATE OF CORRECTION

PATENT NO. : 7,195,999 B2
APPLICATION NO. : 11/176738
DATED : March 27, 2007
INVENTOR(S) : Forbes et al.

It is certified that error appears in the above-identified patent and that said Letters Patent is hereby corrected as shown below:

In column 7, line 37, before "allowance" insert -- substitution temperatures are less than the eutectic temperatures with some --.

In column 9, line 32, delete "haflium" and insert -- hafnium --, therefor.

Signed and Sealed this

Eighteenth Day of March, 2008

JON W. DUDAS
*Director of the United States Patent and Trademark Office*